(12) United States Patent
Ranish et al.

(10) Patent No.: US 7,398,693 B2
(45) Date of Patent: Jul. 15, 2008

(54) ADAPTIVE CONTROL METHOD FOR RAPID THERMAL PROCESSING OF A SUBSTRATE

(75) Inventors: Joseph Michael Ranish, San Jose, CA (US); Tarpan Dixit, San Francisco, CA (US); Dean Jennings, Beverly, MA (US); Balasubramanian Ramachandran, Santa Clara, CA (US); Aaron Hunter, Santa Cruz, CA (US); Wolfgang Aderhold, Cupertino, CA (US); Bruce Adams, Portland, CA (US); Wen Teh Chang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 207 days.

(21) Appl. No.: 11/393,423

(22) Filed: Mar. 30, 2006

(65) Prior Publication Data

US 2007/0238202 A1 Oct. 11, 2007

(51) Int. Cl.
*G01L 9/06* (2006.01)

(52) U.S. Cl. .................................. 73/727; 73/432.1

(58) Field of Classification Search ............ 73/727, 73/432.1
See application file for complete search history.

(56) References Cited

U.S. PATENT DOCUMENTS

| | | | | |
|---|---|---|---|---|
| 4,034,420 A | * | 7/1977 | Gotoh et al. | 165/97 |
| 5,692,676 A | * | 12/1997 | Walker | 237/8 R |
| 5,724,630 A | * | 3/1998 | Mashiba | 399/70 |

* cited by examiner

*Primary Examiner*—Andre J. Allen
*Assistant Examiner*—Jermaine Jenkins
(74) *Attorney, Agent, or Firm*—Patterson & Sheridan, LLP

(57) ABSTRACT

The present invention generally relates to methods for the rapid thermal processing (RTP) of a substrate. Embodiments of the invention include controlling a thermal process using either a real-time adaptive control algorithm or by using a control algorithm that is selected from a suite of fixed control algorithms designed for a variety of substrate types. Selection of the control algorithm is based on optical properties of the substrate measured during the thermal process. In one embodiment, a combination of control algorithms are used, wherein the majority of lamp groupings are controlled with a fixed control algorithm and a substantially smaller number of lamp zones are controlled by an adaptive control algorithm.

33 Claims, 18 Drawing Sheets

ADAPTIVE CONTROL METHOD FOR RAPID THERMAL PROCESSING OF A SUBSTRATE

BACKGROUND OF THE INVENTION

1. Field of the Invention

Embodiments of the present invention generally relate to methods of thermally processing a material such as a semiconductor substrate.

2. Description of the Related Art

A number of applications involve thermal processing of semiconductor and other materials, which require precise measurement and control of the temperature of the material. For instance, processing of a semiconductor substrate requires precise measurement and control of the temperature over a wide range of temperatures. One example of such processing is rapid thermal processing (RTP), which is used for a number of fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dielectric formation by RTO or RTN, thickness, growth temperature, and uniformity of the gate dielectrics are parameters that influence the overall device performance and fabrication yield. Some of these processes require variations in temperature across the substrate of less than a few degrees Celsius.

It is desirable to obtain temperature uniformity in a substrate during thermal processing of the substrate. Temperature uniformity provides uniform process variables on the substrate (e.g. layer thickness, resistivity, etch depth) for temperature activated steps such as film deposition, oxide growth and etching. In addition, temperature uniformity in the substrate is necessary to prevent thermal stress-induced substrate damage such as warpage, defect generation and slip. For example, at 1150° C., a center to edge temperature difference on a four-inch silicon wafer of approximately 5° C. can induce dislocation formation and slip.

Temperature gradients may also be induced by other sources. For example, a substrate may have non-uniform emissivity because of spatial modifications to surface areas or volumes of the substrate. These modifications may include films that have been patterned by photolithography or locally doped regions, such as buried layers for bipolar transistors. In addition, substrate temperature gradients may be induced by localized gas cooling or heating effects related to processing chamber design as well as non-uniform endothermic or exothermic reactions that may occur on the substrate surface during processing.

In addition to minimizing temperature non-uniformity between all regions of a substrate during rapid thermal processing, it is also important that the actual time-temperature trajectory of a substrate varies as little as possible from the desired time-temperature trajectory of the substrate, particularly from the peak temperature. Time-temperature trajectory and peak temperature are described below in conjunction with FIG. 1.

FIG. 1 illustrates an ideal time-temperature trajectory, hereinafter referred to as target time-temperature trajectory 100 for an exemplary rapid thermal process, in this case a spike anneal process. The abscissa represents time, the ordinate represents substrate temperature, and target time-temperature trajectory 100 represents the desired temperature of a substrate at any time during the spike anneal process. At time 120, thermal processing of the substrate begins with the substrate at temperature 130, which is substantially room temperature. The substrate temperature is increased to temperature 132 during initial temperature ramp 201, described below in conjunction with FIG. 2. The substrate temperature is increased using high-intensity lamps, described below in conjunction with FIG. 3 as part of an exemplary RTP chamber. Starting at time 122, the substrate temperature is held constant at temperature 132 for the duration of stabilization period 202. At time 123 the substrate temperature is quickly increased to peak temperature 133 at time 124 and then immediately reduced to temperature 134 at time 125. If peak temperature 133 of a substrate is not met during RTP, important processes on the substrate may not be completed, such as post-implant anneal. If peak temperature 133 is exceeded during RTP, the process may be detrimentally affected in other ways, for example from unwanted diffusion of implanted atoms into the substrate or by exceeding the thermal budget of devices formed on the substrate.

FIG. 2 is a flow chart illustrating a typical process sequence 200 for a rapid thermal process, such as the spike anneal process described above in conjunction with FIG. 1. Generally such a process begins with an initial temperature ramp 201 of the substrate. Until the substrate is at a temperature of about 300° C. to about 400° C., open-loop heating is performed during the first segment of initial temperature ramp 201. Referring back to FIG. 1, open-loop heating takes place between time 120 and 121. During open-loop heating, no substrate temperature feedback is incorporated into controlling the process and instead lamp power is applied to the substrate at pre-determined values for a pre-determined duration in order to heat the substrate to a temperature regime in which the substrate will be substantially opaque to the majority of lamp energy being applied to it. Below about 300° C. a typical RTP substrate, such as a silicon wafer, is largely transparent to much of the radiant energy produced by typical heating lamps. When this is the case, radiant energy that passes through the substrate may then be detected by the pyrometers that measure substrate backside temperature, producing an inaccurate substrate temperature measurement. For a closed-loop heating control algorithm, inaccurate substrate temperature measurement may result in serious control problems during the initial temperature ramp 201, such as instability and/or hunting. Open-loop heating is typically used at the beginning of RTP to avoid this problem. The set points for open-loop heating are generally determined empirically.

After the substrate is heated to between about 300° C. to about 400° C., the initial temperature ramp 201 is then generally completed using a closed-loop control algorithm to bring the substrate temperature to a stabilization temperature of about 500° C. to about 700° C. Closed-loop control incorporates temperature measurement of the substrate at a given time step in the thermal process in one or more pyrometer zones into the control algorithm in order to fine-tune the power-output of the heating lamps for the subsequent time step. Time steps may be relatively small, for example 0.1 or 0.01 seconds. The minimum time step size is generally limited by the sampling rate of the temperature sensors used to control the heating process. The use of closed-loop control minimizes error between desired and actual substrate temperatures.

Because precise temperature control is so important in RTP, model-based control algorithms are sometimes used instead of conventional PID control algorithms as part of closed-loop temperature control during thermal processing. A model-based control algorithm—also known as a model-based controller—may further reduce the error between actual substrate temperature and the target temperature during processing compared to a standard PID control loop. Rather than responding to a measured error by changing an input (in this case lamp power) that is proportional to the measured error, a model-based control algorithm applies an energy transfer model of the substrate and chamber at each time step to predict how the substrate will behave thermally in the next time step. Not unlike a simulation program, the model-based controller includes all relevant aspects of the system into the heat transfer model, including the optical properties of the substrate and chamber walls, the power output and location of the lamps, etc. The controller considers all these factors and then controls the power output of each lamp or group of lamps based on the current temperature of the substrate, the desired temperature and the modeled response of the entire system. This predictive method allows for less variation from a target temperature during thermal processing-especially when the target temperature is changing quickly as a function of time-making it useful for spike anneal and related rapid thermal processes.

A notable drawback of model-based controllers is that their ability to precisely control a substrate temperature to a desired time-temperature trajectory is limited by the accuracy of the assumptions on which the model is based. The most important factors that need to be accurately taken into account by the model-based controller are aspects of the process chamber, such as the size and shape of the chamber, the lamp power, etc., and the optical properties of the substrate, including substrate emissivity, absorptivity, reflectivity and transmissivity. "Emissivity," "absorptivity," "reflectivity" and "transmissivity," as used herein, refer to those properties of a material for light wavelengths between about 0.2 µm and about 5 µm. A model-based controller may be corrected through testing to more accurately represent a particular RTP chamber's behavior during thermal processing; empirical factors, also known as "fudge factors", are typically included in model-based control algorithms and may be determined through trial and error to fine-tune a controller's accuracy. However, because a controller's calculations are based on a specific substrate type with fixed optical properties, the model-based algorithm will be inherently inaccurate for all but a single type of substrate. This is because the optical properties of different substrates vary dramatically depending on how the substrate has been processed prior to RTP. For example, highly reflective substrates, such as metallic substrates, and light-absorbing substrates, such as heavily patterned substrates, may both be processed in the same RTP chamber using the same control algorithm. Unless a different controller has been developed to account for each substrate type being processed, sub-optimal temperature control will result. Multiple controllers may be programmed for use in a single RTP chamber, however each controller requires fine-tuning based on repeated experiments. In some situations, for example in a semiconductor foundry, there may be hundreds of different substrate types processed in a given RTP chamber and each type may have its own unique combination of optical properties. This makes optimizing a specialized controller for each substrate type to be processed impracticable.

Referring back to FIG. 2, once the substrate reaches stabilization temperature at the end of initial temperature ramp 201, a stabilization period 202 generally takes place after. The stabilization period 202 is intended to eliminate thermal gradients that have been imprinted on the substrate during the initial temperature ramp 201 by allowing the substrate to equilibrate prior to beginning spike anneal 203, which is the temperature sensitive segment of the thermal process. Non-uniformities in substrate temperature that are present at the beginning of spike anneal 203 are unlikely to be corrected during the process. The stabilization period 202 is between about 5 seconds and about 30 seconds in length, typically between about 10 seconds and about 20 seconds. The substrate temperature is controlled to remain at the stabilization temperature 132, as illustrated in FIG. 1, which may be between about 500° C. to about 700° C., depending on the particular thermal process.

Upon completion of the stabilization period 202, spike anneal 203 then begins. In this example, spike anneal 203 is the segment of the process in which the thermal processing of the substrate actually takes place. A preferred application of the spike anneal process is to perform the anneal on a substrate after boron implant. In this case, spike anneal 203 relocates the implanted boron from random locations in the crystal to electrically active sites in the silicon lattice while minimizing the thermal exposure of the substrate. As illustrated in FIG. 1, spike anneal 203 takes place between times 123 and 124 and is followed by a cool-down 204. Ramp rates of the substrate temperature during spike anneal 203 are generally between about 150° C./s and about 300° C./s and peak temperature 133 is about 1000° C. to about 1200° C./s, meaning that spike anneal 203 generally only last a few seconds. Hence, there is little time for a control algorithm to correct variation in substrate temperature from the target time-temperature trajectory 100 during the most temperature sensitive segment of the thermal process. Any variation that occurs in substrate temperature from the target temperature during this segment of the rapid thermal process, e.g. overshoot, undershoot or widespike, will reduce the peak temperature repeatability between substrates. Referring back to FIG. 2, spike anneal 203 is then followed by cool-down 204, ending the rapid thermal processing of the substrate.

As noted above, it is important for temperatures to be as uniform as practicable in a substrate during thermal processing of the substrate. In practice, the edge region of a substrate is thermally affected by the periphery of the RTP chamber more than are other regions of the substrate, leading to chronic temperature non-uniformities residing in the edge region. Standard control algorithms are designed to respond to radial temperature non-uniformities once detected. For very short processes, such as spike anneal processes, the control algorithm may not be able to compensate quickly enough, resulting in temperature non-uniformities near the edge of the substrate. Further, because the current design of RTP chambers is geared toward radial temperature non-uniformity on a circular substrate, this method of temperature control is unable to correct non-radial temperature non-uniformities, for example a "cold spot" that is not symmetrically centered on the substrate.

Thus, there is still a need for methods and apparatus for controlling the rapid thermal processing of a substrate that may be used for a wide range of substrates, that requires minimal tuning, that improves peak temperature repeatability, that allows closed-loop control to be used at lower temperatures and that minimizes temperature non-uniformity on the substrate.

SUMMARY OF THE INVENTION

The present invention generally relates to methods and apparatus for the rapid thermal processing (RTP) of a substrate. Embodiments of the invention include controlling a thermal process using either a real-time adaptive control algorithm or by using a control algorithm that is selected from a suite of fixed control algorithms designed for a variety of substrate types. Selection of the control algorithm is based on optical properties of the substrate measured during the thermal process. In one embodiment, a combination of control algorithms are used, wherein the majority of lamp groupings are controlled with a fixed control algorithm and a substantially smaller number of lamp zones are controlled by an adaptive control algorithm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures.

DETAILED DESCRIPTION

The invention generally relates to methods and apparatus for the rapid thermal processing of a substrate. Embodiments contemplate the use of control algorithms for providing improved peak temperature repeatability, including a real-time adaptive control algorithm, a method for selecting a fixed control algorithm based on substrate properties and a combined method, wherein only a small number of zones utilize the adaptive control algorithm and the remainder are controlled by a computationally less intensive control algorithm.

Figure 3:
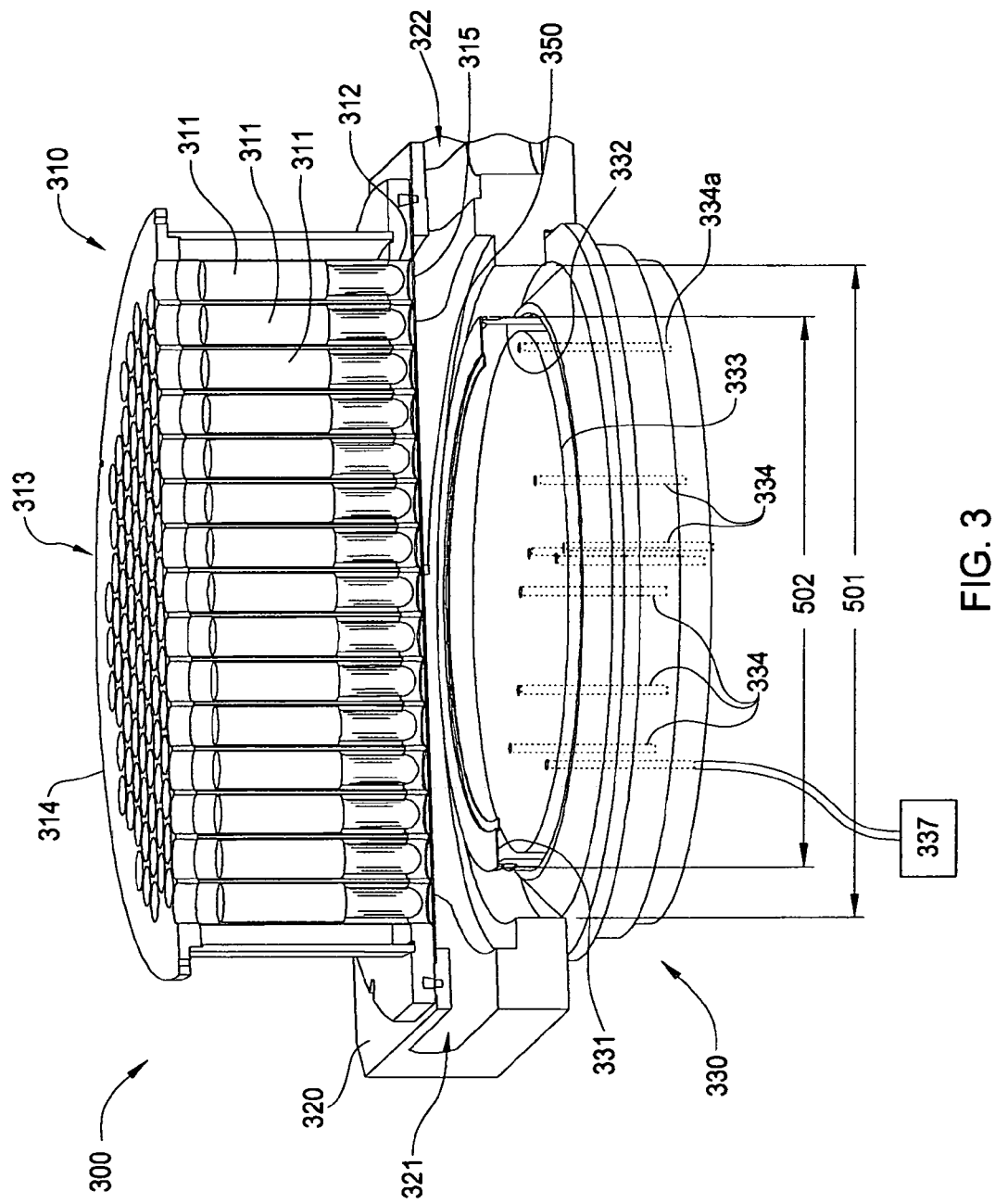
FIG. 3 is a partial perspective diagram of an exemplary RTP chamber that may incorporate embodiments of the invention.

FIG. 3 is a partial perspective diagram of an exemplary RTP chamber that may incorporate embodiments of the invention. The exemplary RTP chamber, hereinafter referred to as chamber 300, has been cross-sectioned for clarity. The chamber 300 generally consists of a lamp assembly 310, a chamber body 320 and a substrate support assembly 330. For clarity, only the upper portion of chamber body 320 is illustrated in FIG. 3.

Lamp assembly 310 includes a plurality of lamps 311, each of which is positioned inside a reflective light pipe 312. The lamps may be incandescent lamps, such as tungsten-halogen, or other high output lamps, such as discharge lamps. Typically, lamp output may be varied up to about 500 W per lamp. Together, the reflective light pipes 312 form a honeycomb array 313 inside a water-cooled housing 314. Honeycomb array 313 of reflective light pipes 312 is described below in conjunction with FIG. 5. A very thin quartz window 315 forms the bottom surface of lamp assembly 310, separating lamp assembly 310 from the vacuum usually present in chamber 300. Quartz is typically used for quartz window 315 since it is transparent to infrared light. Lamp assembly 310 is attached to the upper surface of chamber body 320 in a vacuum-tight manner.

Chamber body 320 includes the walls and floor of chamber 300 as well as a substrate opening 321 and exhaust opening 322. Substrates are delivered into and removed from chamber 300 through substrate opening 321 and a vacuum pump (not shown) evacuates chamber 300 through exhaust opening 322. Slit or gate valves (not shown) may be used to seal substrate opening 321 and exhaust opening 322 when necessary.

The substrate support assembly 330 is contained inside chamber body 320 and includes an edge ring 331, a rotating quartz cylinder 332, a reflector plate 333 and an array of fiber optic probes 334. Edge ring 331 rests on rotating quartz cylinder 332 and during substrate processing supports the substrate (not shown for clarity) approximately 25 mm below quartz window 315. Edge ring 331 typically consists of a hard material with a small coefficient of thermal expansion, such as silicon carbide, to prevent excessive expansion and contraction during thermal processing. Rotating quartz cylinder 332 rotates between about 50 rpm and about 300 rpm during substrate processing to maximize substrate temperature uniformity during processing by minimizing the effect of thermal asymmetries in chamber 300 on the substrate. Reflector plate 333 is positioned about 5 mm beneath the substrate. Fiber optic probes 334, also known as pyrometer probes, penetrate reflector plate 333 and are directed at the bottom of the substrate during thermal processing. Fiber optic probes 334 transmit radiant energy to pyrometers (not shown) for determining substrate temperature and, in some embodiments, substrate frontside emissivity and reflectivity during thermal processing. When lamps 311 are incandescent lamps, the pyrometers are typically adapted to measure broadband emissions from the backside of the substrate between wavelengths of about 0.2 micrometers ($\mu m$) to about 5 $\mu m$. This is the range of the spectrum in which most radiant energy is applied to the substrate.

Figure 4:
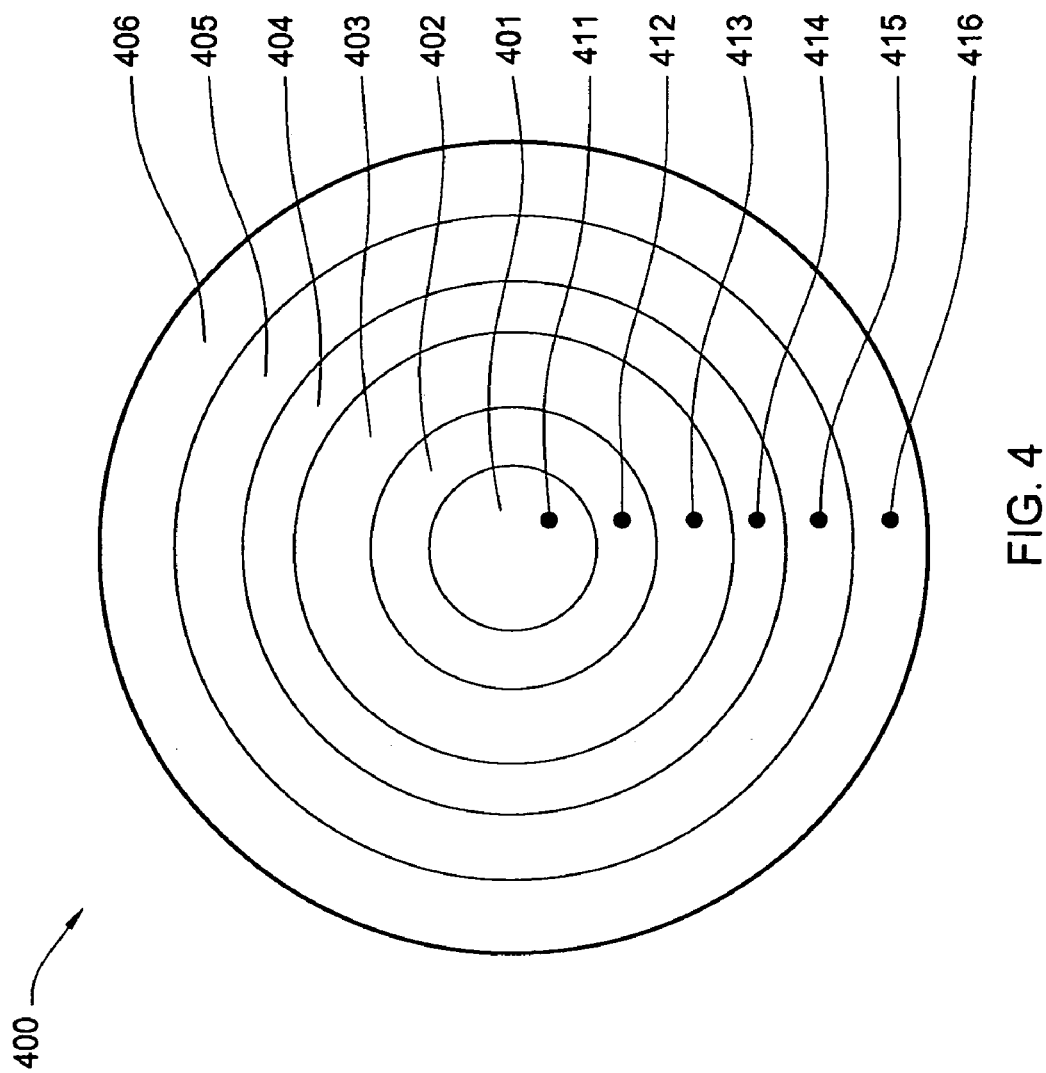
FIG. 4 is a schematic plan view of a substrate divided into pyrometer zones.

To better control temperature uniformity across a substrate, the substrate is divided into multiple zones, known as pyrometer zones. Each pyrometer zone is a region of a substrate that is measured by a given pyrometer as the substrate rotates during thermal processing. Pyrometer zones are typically annular regions, except for the zone located at the center of a substrate, which may be circular. FIG. 4 is a schematic plan view of a substrate 400 divided into pyrometer zones 401-406. For reference, pyrometer locations 411-416 are illustrated in relation to the pyrometer zones when substrate 400 is processing in an RTP chamber. Each pyrometer location is a unique radial displacement from the center of the substrate. This configuration of pyrometer zones is shown for a substrate 400 that is 300 mm in diameter. This configuration may be used for substrates of other diameters as well. Conversely, different configurations of pyrometer zones may also be used for a 300 mm diameter substrate, for example more or fewer zones maybe used than in this example. Further, the radial dimension of each zone is not assumed to be identical to that of the other pyrometer zones.

Figure 5:
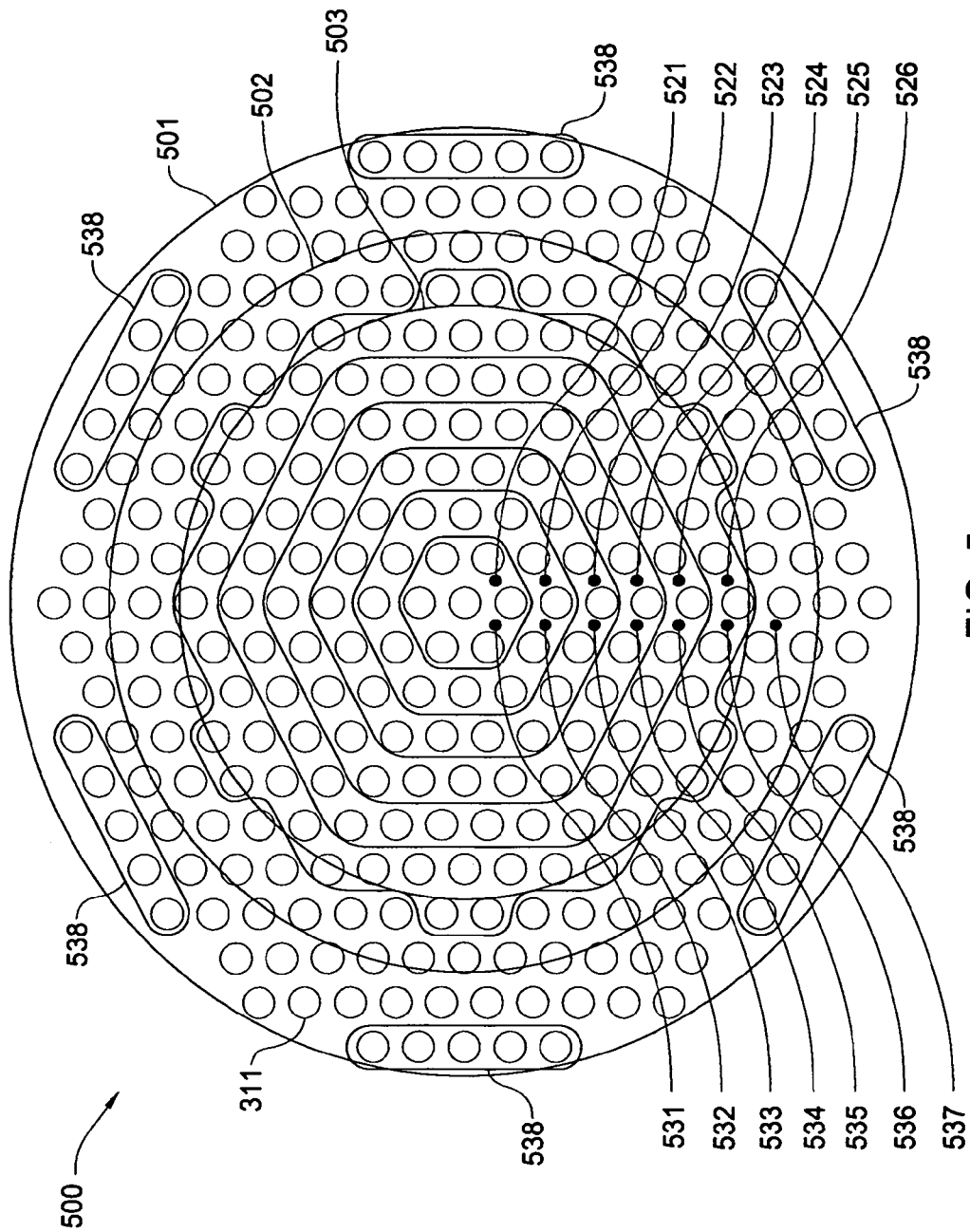
FIG. 5 is a schematic plan view of one possible configuration of lamps in a honeycomb array for an RTP chamber.
Figure 15:
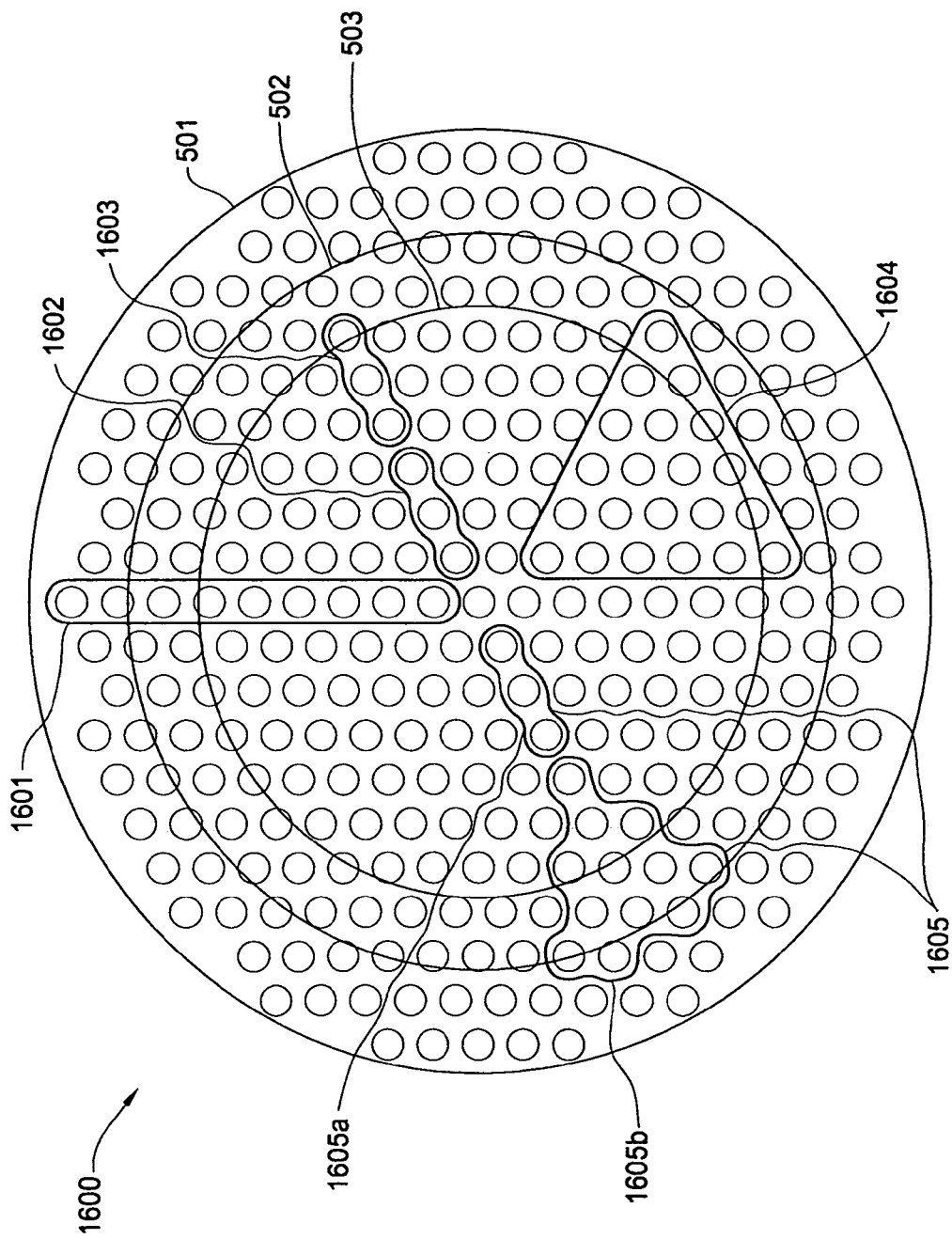
FIG. 15 is a schematic plan view of possible non-concentric configurations of lamp groupings for an RTP chamber.

To further improve temperature uniformity, the lamps 311 contained in lamp assembly 310 are controlled in groups, known as lamp zones. FIG. 5 is a schematic plan view of one possible configuration 500 of lamps 311 in a honeycomb array 313 for chamber 300. For reference, the inner diameter 501 of chamber 300, the outer diameter 502 of edge ring 331 and the outer diameter 503 of a substrate are illustrated in relation to honeycomb array 313. FIG. 5 also includes corresponding pyrometer locations 521-526 that may be used in conjunction with this particular lamp configuration. The lamps 311 in honeycomb array 313 are grouped into lamp groupings 531-538. A lamp grouping may consist of a substantially concentric group of lamps, such as lamp groupings 531-35, symmetrical but non-concentric groupings of lamps, such as lamp grouping 538, or combinations of both, such as lamp groupings 536 and 537. In one aspect, one or more lamp groupings in honeycomb array 313 may consist of a non-concentric, asymmetric grouping of lamps, described below in conjunction with FIG. 15. The power output of the individual lamps in a lamp grouping is typically the same for all lamps in a lamp grouping.

Operation of all aspects of chamber 300, including collection of pyrometer data, control of lamps and actuation of valves and substrate handling robots, are timed and managed by a computer or programmable logic controller, typically referred to as a system controller (not shown). In some cases the system controller is dedicated to operating only a particular RTP chamber, in other cases, it may be used to operate and coordinate all chambers, sensors and substrate transfer robots positioned on a complete substrate processing system.

To better control the time-temperature trajectory of a substrate during RTP, the thermal process may be controlled in consecutive time increments, referred to herein as time steps. To minimize deviation of the substrate from a targeted time-temperature trajectory, the time steps are preferably of short duration, for example on the order of about 0.1 sec to about 0.01 seconds or less.

For a given time step in a thermal process, each pyrometer zone of a substrate is heated to a desired temperature. Typically in RTP, the target temperature in each pyrometer zone is the same for the entire substrate. Taken together, the desired temperatures for each time step form target time-temperature trajectory 100 for a substrate, illustrated in FIG. 1.

Generally, in a given time step each pyrometer measures the temperature of the substrate in its respective pyrometer zone. This information is relayed to the system controller, which then uses a control algorithm to determine the power output for each lamp grouping for the next time step to heat the substrate to the desired temperature for that time step. The majority of radiant energy heating a given pyrometer zone originates from the lamp groupings closest to that pyrometer zone. For example, referring to FIG. 5, the pyrometer zone measured by the pyrometer location 521 is primarily affected by lamp grouping 531. Because of this, one or more lamp groupings may be "mapped" to a particular pyrometer zone, i.e., primarily controlled based on the temperature measured for that pyrometer zone. However, because there are other significant energy sources that also heat a given pyrometer zone, for example proximal lamp groupings, it is important for the control algorithm to take these other energy sources into account for accurate temperature control of the substrate, particularly in short, rapidly changing processes such as spike anneal. Inaccurate prediction of input power for each time step may lead to significant deviation of substrate temperature from the desired time-temperature trajectory for the thermal process.

Factors that effect accurate prediction of input power for a pyrometer zone include the optical properties of the substrate, such as emissivity, transmissivity, and reflectivity, radiant heat from the chamber walls, lamp response time and, for the pyrometer zone corresponding to the edge region of the substrate, heat transfer from the edge ring. Another confounding factor is the effect of each lamp grouping on more distant pyrometer zones. This is referred to as an influence matrix and is a function not only of chamber geometry, but also substrate frontside reflectivity. For a substrate that reflects any incident radiant energy, i.e., the substrate reflectivity>0, the control algorithm should not assume that radiant energy from a lamp grouping will only affect the pyrometer zone directly beneath that lamp grouping. A significant fraction of the incident radiant energy may be reflected from the substrate and instead heat other pyrometer zones. For example, referring back to FIG. 5, when processing a highly reflective substrate, as much as 5% of the energy from lamp grouping 531 may heat the pyrometer zone measured by pyrometer location 524.

The above factors may be incorporated into control algorithms of the prior art, such as model-based control algorithms, described above. However, because so many important components of the applicable heat transfer models are dependent on optical properties of the particular substrate, the predictive accuracy of model-based controllers varies with substrate type. If the frontside emissivity of a substrate is different from that used to develop a model-based control algorithm, accuracy of the temperature control will suffer. Aspects of the invention contemplate methods for controlling rapid thermal processing of substrates that are not based on a property of the substrate, such as an assumed frontside emissivity or reflectivity, and therefore more accurately predict the required power from each lamp grouping.

Closed-Loop Control of Substrate Temperature

Several methods involving control algorithms are contemplated by the invention for providing improved peak temperature repeatability. In one aspect, a real-time adaptive control algorithm is used to control the heating of a substrate, wherein the instantaneous heating rate of the substrate is determined for each time step of the process to calculate the desired power input for the next step in the process. In another aspect, a method is used wherein an appropriate control algorithm is selected from a suite of possible fixed control algorithms. The selection of the fixed control algorithm is based on measured substrate properties, such as transmissivity or frontside emissivity. In another aspect, a combined method is disclosed, wherein only a small number of lamp groupings utilize an adaptive control algorithm and the remainder are controlled by a computationally less intensive fixed control algorithm, such as a binned algorithm.

Adaptive Control Method

In one aspect, an adaptive control algorithm is used to control lamp power during the thermal processing of a substrate. Unlike the prior art, the control algorithm disclosed herein does not rely on assumed values for the optical properties of the substrate. Instead, the algorithm uses the currently measured substrate temperature and the power applied in the previous time step to determine the instantaneous heating rate of the substrate for the current time step. The instantaneous heating rate is primarily a function of the optical properties of the substrate, including frontside emissivity, transmissivity and frontside reflectivity. Because these properties of a substrate vary significantly with substrate temperature, an algorithm based on properties of the substrate, such as a model-based control algorithm, will suffer from increasing inaccuracy as the actual optical properties of the actual substrate diverge from the values assumed by the model. Such inaccuracies limit the predictive accuracy of the control algorithm since for every time step the behavior of the substrate is incorrectly calculated. This may lead to poor process repeatability and possibly control instability. In contrast, the algorithm disclosed herein calculates an instantaneous heating rate based on the actual behavior of the substrate in the previous time step and therefore does not rely on assumed values of the substrate's optical properties.

For each pyrometer zone, the total power required for the zone to reach a target temperature is described by Equation (1):

$$P_{total} = P_{ramp} + P_{steady\ state} \quad (1)$$

where:

$P_{total}$=the total power required during the next time step for that zone to reach the desired temperature;

$P_{ramp}$=the power required to heat the pyrometer zone during the next time step from the current measured temperature to the desired temperature; and $P_{steady\ state}$=the power required to cancel heat loss from the pyrometer zone during the time step and therefore keep the pyrometer zone at the same temperature.

Figure 2:
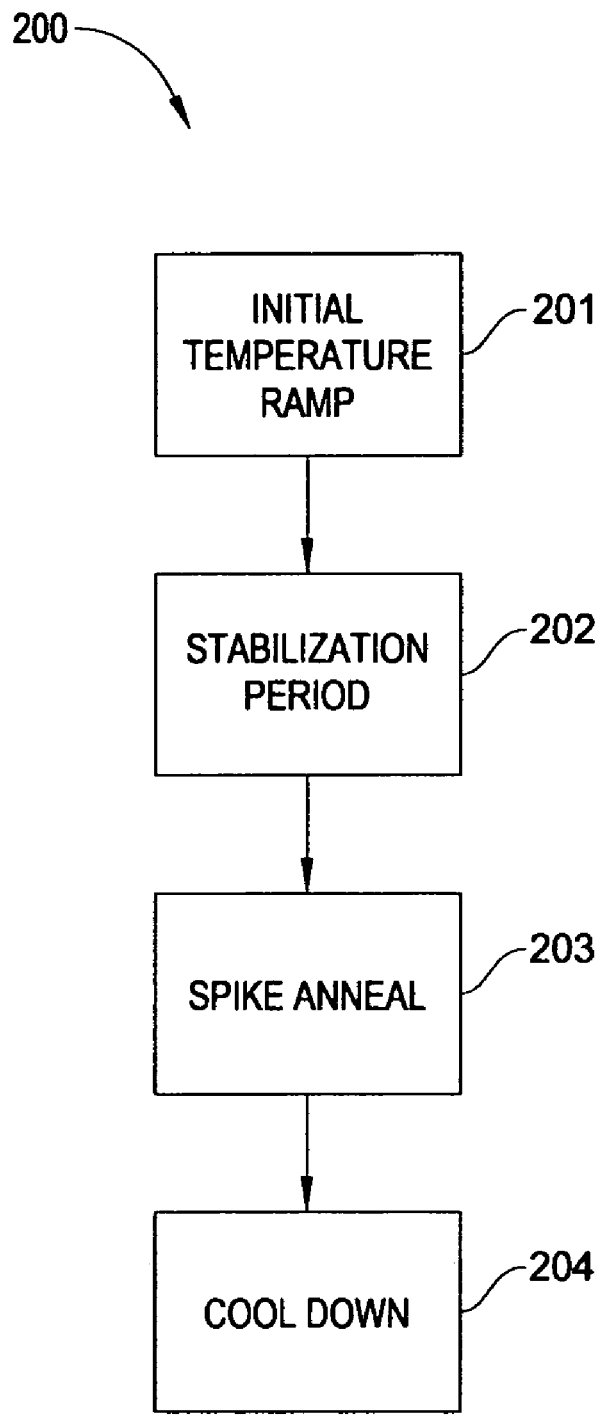
FIG. 2 (Prior Art) is a flow chart illustrating a typical process sequence for a rapid thermal process.

During stabilization period 202, described above in conjunction with FIG. 2, $P_{ramp}$=0. Precise temperature control is not critical during this segment of the thermal processing of the substrate, but uniformity of substrate temperature is desired. As noted above, the stabilization step allows temperature gradients present on the substrate from the initial temperature ramp 201 to equilibrate. This ensures that all regions of the substrate begin the temperature sensitive spike anneal 203 from the same thermal "starting point", improving the probability that all regions on the substrate experience the same thermal process.

During spike anneal 203, any inaccuracies present in the calculation of either $P_{ramp}$ or $P_{steady\ state}$ may significantly affect the results of the thermal process. Both terms ($P_{ramp}$ and $P_{steady\ state}$) are strongly dependent on substrate optical properties. At typical spike anneal process temperatures, i.e. greater than about 700° C., substrate frontside reflectivity and emissivity are the most important properties since transmissivity of a typical substrate is essentially zero at that temperature. The values of these properties change with substrate temperature and any model-based controller will therefore be increasingly inaccurate—unless the model is based on a substrate whose properties vary with temperature exactly the same as the substrate being processed. As there are many types of substrates that may be processed in a given RTP chamber, this is generally not the case. Different substrate types range from highly reflective, metallic substrates to relatively dark, heavily patterned substrates. Rather than measuring a temperature error and trying to predict, based on an approximate model, the thermal response of the substrate in the next time step to reduce that error, the invention contemplates a method that calculates the actual thermal behavior of the substrate in the most recent time steps, i.e. the instantaneous heating rate of the substrate, and then uses that information to more accurately predict the required instantaneous power input for each pyrometer zone of the substrate.

Figure 6:
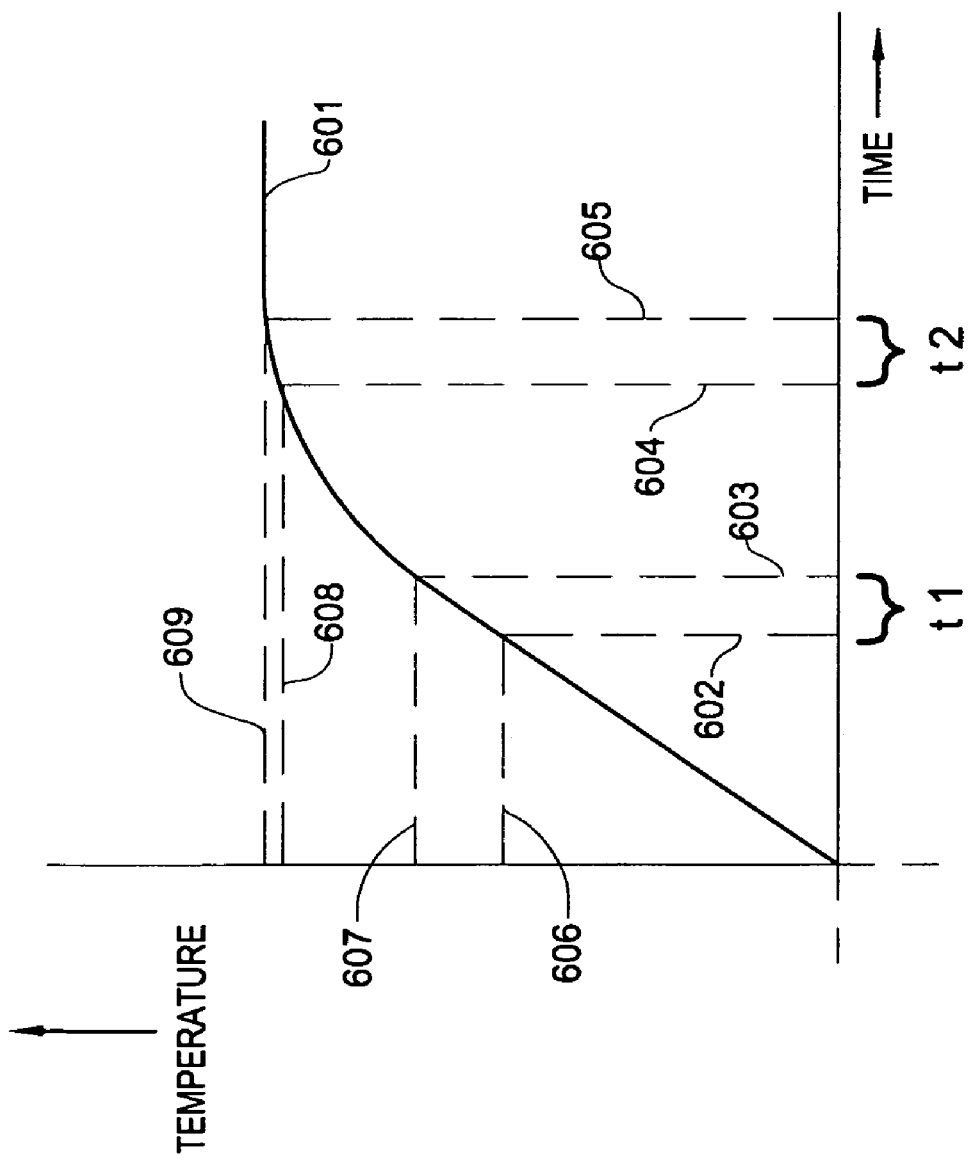
FIG. 6 is a graph illustrating the time-temperature trajectory of one pyrometer zone of a substrate during RTP, wherein the input power is constant throughout the process.

During RTP, the heating rate of a substrate, i.e. the rate of temperature increase of the substrate for a given input power, is not a constant value. This is because $P_{ramp}$ and $P_{steady\ state}$ are both functions of the substrate's optical properties, which in turn vary with substrate temperature. For example, at higher temperatures, the magnitude of $P_{steady\ state}$ of a substrate is much greater than $P_{steady\ state}$ at lower temperatures. This is demonstrated in FIG. 6. As an illustrative example, FIG. 6 is a graph illustrating the time-temperature trajectory 601 of one pyrometer zone of a substrate during RTP, wherein the input power, i.e. $P_{total}$, is constant throughout the process. The abscissa represents time and the ordinate represents the temperature of the pyrometer zone. A first time interval t1 takes place between times 602 and 603 and a second time interval t2 takes place between times 604 and 605. The time intervals t1 and t2 are of identical length. During time interval t1, the zone increases in temperature from temperature 606 to temperature 607. The temperature ramp rate, also known as the ramp rate, for one pyrometer zone of a substrate for one time step is defined herein as the rate of temperature increase of a pyrometer zone during one time step, e.g., time interval t1 or t2. The ramp rate RR1 for time interval t1 is represented graphically as the average slope of time-temperature trajectory 601 during time interval t1 and is defined mathematically as:

$$RR1 = T_{(607-606)}/t_1 \quad (2)$$

where:

$T_{(607-606)}$=the temperature difference between temperature 607 and 606; and $t_1$=the duration of time interval t1.

Similarly, the ramp rate RR2 for time interval t2 is defined as:

$$RR2 = T_{(609-608)}/t_2 \quad (3)$$

where:

$T_{(609-608)}$=the temperature difference between temperature 609 and 608; and $t_2$=the duration of time interval t2.

As illustrated by FIG. 6, RR2<RR1 when $P_{total}$ is held constant for the thermal process. This is due to the increasing heat losses associated with a higher temperature substrate during time interval t2. Higher heat losses mean that $P_{steady\ state}$ is also higher. Since $P_{total}$ is constant in this example, less power is available for $P_{ramp}$, and, hence, RR2 is much smaller than RR1 even though the same input power is being applied to the pyrometer zone.

FIG. 6 demonstrates that actual heat loss from a substrate is a complicated function of substrate temperature, frontside emissivity, absorptivity and reflectivity, which makes accurate prediction of substrate thermal behavior for every time step of a thermal process difficult. This is what a model-based controller attempts to do when calculating the required input power for each pyrometer zone. In contrast, the adaptive control method disclosed herein assumes that the instantaneous heating rate, or heating rate function, of a pyrometer zone of a substrate is a simple linear function of input power to the pyrometer zone. As used herein, "instantaneous heating rate" is defined as the function describing the heating rate for one pyrometer zone of a substrate for one time step. The instantaneous heating rate for any time step is recalculated each time step based on the thermal behavior of the pyrometer zone in the previous time step. When time steps are relatively short, e.g. on the order of about 0.01 seconds, this assumption can be very accurate.

As stated above, the instantaneous heating rate of a pyrometer zone of a substrate is assumed to be a linear function proportional to the input power and may be defined mathematically as:

$$RR = (m \times P_p) + C \quad (4)$$

where:

RR=ramp rate of the pyrometer zone during a time step;

m=the slope of the heating rate function (Note: this is to be distinguished from the slope of a time-temperature trajectory as illustrated in FIG. 6, which is the ramp rate);

$P_p$=the power applied to the pyrometer zone during the time step; and

C=a constant, also known as the "intercept" for a linear equation such as Equation (4).

When the instantaneous heating rate for a pyrometer zone is known, i.e. the slope m and intercept C in Equation (4) have been determined, the power required for that pyrometer zone may be determined based on the ramp rate for the pyrometer zone for the next time step. As shown in Equations (2) and (3), the ramp rate for a pyrometer zone for a given time step is a function of the current temperature of the pyrometer zone, the target temperature of the pyrometer zone and the length of the time interval. The target temperature of the pyrometer zone for each time step is taken from a look-up table based on a desired time-temperature trajectory. The duration of the time step is also known. Hence, the desired ramp rate, RR, in Equation (4) is a known quantity for a time step once the current temperature is measured at the beginning of the current time step. This allows the calculation of the power $P_p$ required during the time step that will result in the desired ramp rate RR of the pyrometer zone.

Because the thermal behavior—and therefore the instantaneous heating rate—of a pyrometer zone changes throughout a thermal process, the slope m and intercept C in Equation (4) need to be solved for at each time step of the thermal process. This is done by assuming that the heating rate function does not vary significantly over relatively short periods of time, such as between two consecutive time steps, and then solving for slope m and intercept C based on the thermal behavior of the substrate in the last two time steps. For example, in a first time step, a known power $P_{p1}$ is applied to a pyrometer zone and the zone increases in temperature, which produces a known ramp rate RR1. In a second time step, a different, known power $P_{p2}$ is applied to the pyrometer zone and the zone again increases in temperature, producing a known ramp rate RR2. In one example, the magnitude of known power $P_{p2}$ differs from known power $P_{p1}$ by at least about 10% of the value of known power $P_{p1}$. Therefore, assuming that the values of slope m and intercept C remain substantially constant over the relatively short interval of time including two or three time steps, these two unknowns may be solved for using the following two equations:

$$RR1 = (m \times P_{p1}) + C \quad (4a)$$

$$RR2 = (m \times P_{p2}) + C \quad (4b)$$

This procedure is repeated for each time step of the thermal process for each pyrometer zone of the substrate. Because the instantaneous heating rate of the substrate is updated for each time step of the thermal process, the actual time-temperature trajectory of the substrate may more closely track the desired time-temperature trajectory than a model-based control algorithm. This is particularly true when the model-based controller is based on a substrate type that has substantially different optical properties than the substrate being processed.

It is important to note that the accuracy of the values of known power $P_{p1}$ and known power $P_{p2}$ are important for accurate control of a thermal process. Because of this, when the lamps used in an RTP chamber are incandescent lamps, the instantaneous lamp power, i.e. the radiant power produced by a lamp or lamp grouping at any point in time, cannot be determined using only the voltage applied to the lamp or lamp grouping. Due to the transient response of a lamp filament whenever lamp power is increased or decreased, applied voltage is not representative of an incandescent lamp's power unless the lamp has reached thermal equilibrium at that power. This is generally not the case during RTP as lamp powers are changed frequently and over short time intervals. Instead, the instantaneous power of an incandescent lamp used in an RTP chamber may be determined accurately by calculating the instantaneous lamp resistance $R_{lamp}$ from the expression:

$$V = i_{Inst} R_{lamp}$$

where:

V=the voltage applied to the lamp or lamp grouping; and $i_{InSt}$=the instantaneous lamp current.

For a given incandescent lamp, the instantaneous lamp resistance is known to correspond to an exact power.

Figure 7:
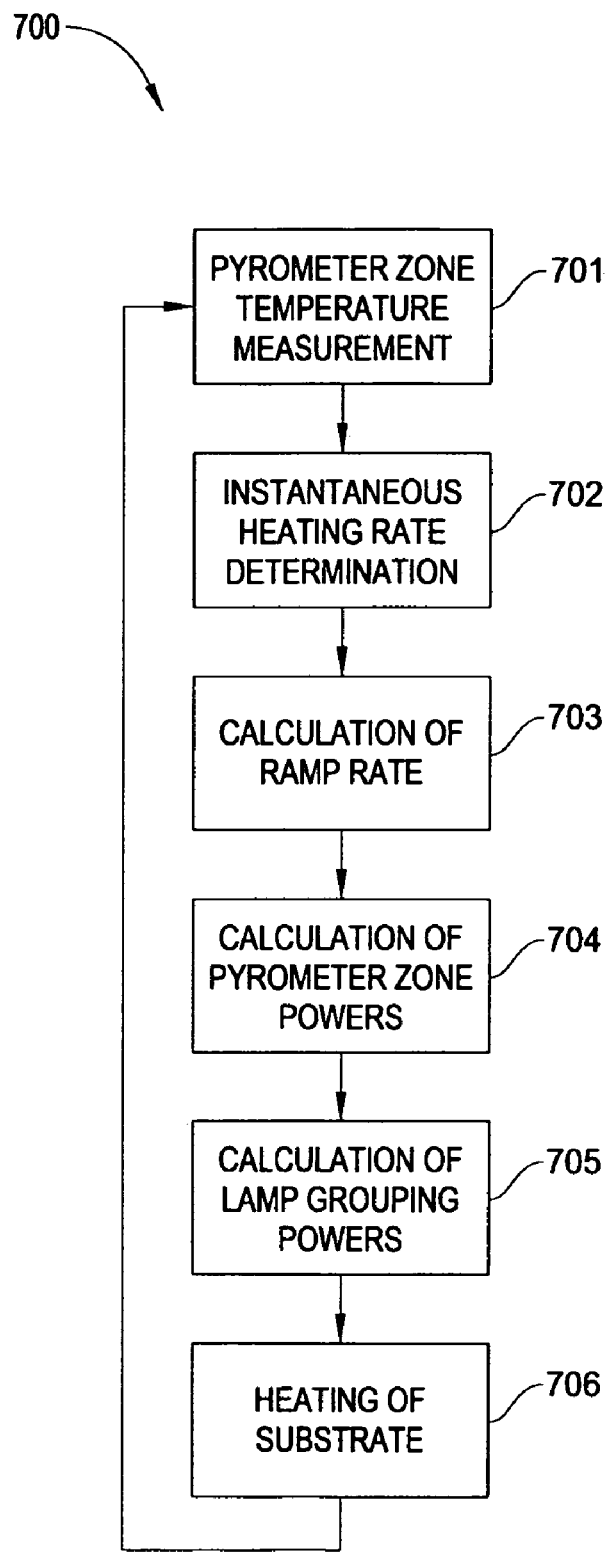
FIG. 7 illustrates a flow chart of an adaptive control method that may be included in aspects of the invention.

FIG. 7 illustrates a flow chart of an adaptive control method 700 that may be included in aspects of the invention. Referring back to FIG. 1, this control method is best suited for use as a closed-loop control algorithm for controlling substrate temperature during RTP, including stabilization period 202, spike anneal 203 and the higher temperature segment of the initial temperature ramp 201.

In the first step of adaptive control method 700, pyrometer zone temperature measurement 701 takes place.

Instantaneous heating rate determination 702 then takes place for each pyrometer zone on the substrate. As described above in conjunction with Equations (4), (4a) and (4b), the values of slope m and intercept C are found for Equation (4) by solving the system of Equations (4a) and (4b) using RR1, RR2, known power $P_{p1}$ and known power $P_{p2}$, which are known values for previous time steps. In one aspect, the values of slope m and intercept C for the instantaneous heating rate of the current time step are taken directly from the solution of Equations (4a) and (4b). In another aspect, the updated values for slope m and intercept C for the current time step are a weighted average of the solution for Equation (4) and one or more previous values of slope m and intercept C. In one example, the weighted average calculation for the updated values of slope m and intercept C is an exponentially weighted average, wherein the most recent values for slope m and intercept C have a disproportionately larger contribution to the updated values of slope m and intercept C than older values of slope m and intercept C. In this aspect, mathematical instability of Equation (4) may be avoided when sudden, large changes in the values of slope m and/or intercept C occur between consecutive time steps. In another example of this aspect, the weighting schemes for slope m and intercept C are not the same.

In the next step of adaptive control method 700, calculation of ramp rate 703 takes place, wherein the ramp rate RR for each pyrometer zone is calculated using the following expression:

$$RR = \Delta T/t \qquad (2a)$$

where:

$\Delta T$=the temperature difference between the current measured temperature for the pyrometer zone and the temperature required at the end of the time step, as dictated by a look-up table based on the desired time-temperature trajectory for the substrate; and t=the duration of current time step.

In one aspect, the overall ramp rate of the substrate is slowed by reducing the required temperature for the entire substrate to a value below that specified for that time step by the time-temperature trajectory look-up table. This limits temperature non-uniformity between pyrometer zones by allowing some pyrometer zones that have been unable to track to the specified time-temperature trajectory to equilibrate with the other pyrometer zones. This method may be used to prevent serious temperature non-uniformity whenever a pyrometer zone cannot be heated quickly enough—even with maximum lamp output from the associated lamp groupings mapped to that pyrometer zone. In one example, the overall ramp rate of the substrate is reduced whenever one or more pyrometer zones of the substrate is less than about 3° C. below the target temperature for two or more consecutive time steps. In another example, the overall ramp rate of the substrate is reduced whenever one or more pyrometer zones of the substrate is less than about 5° C. below the target temperature for two or more time steps.

Calculation of pyrometer zone powers 704 is the next step of adaptive control method 700. Pyrometer zone power $P_p$ for each pyrometer zone for the current time step is calculated directly using Equation (4), based on the ramp rate determined in calculation of ramp rate 703.

Calculation of lamp grouping powers 705 is then carried out. The lamp grouping power $P_{lg}$ for a particular lamp grouping is generally not equal to the pyrometer zone power $P_p$ for the pyrometer zone to which that lamp grouping is matched. This is because one lamp grouping affects more than just the pyrometer zone to which it is mapped. This effect, the influence matrix, is described above in conjunction with FIG. 5. For a particular RTP chamber, the influence matrix, i.e. how all the powers of all the lamp groupings produce a local irradiance over a particular pyrometer zone, is typically known. Generally, this information may be obtained through empirical testing, wherein the resultant irradiance of each lamp grouping on each pyrometer zone is quantified for an RTP chamber. Such testing is a typical component of characterizing an RTP chamber and is known in the art. Given this influence matrix and each pyrometer zone's pyrometer zone power $P_p$, which is calculated in the previous step of adaptive control method 700, the lamp grouping power $P_{lg}$ may be calculated directly for each lamp grouping in the RTP chamber by inverting the influence matrix. Aspects of the invention also contemplate the determination of the influence matrix for each substrate "on the fly", i.e. during the early non-critical stages of RTP. These aspects are described below under Determination of Substrate Optical Properties.

Figure 8A:
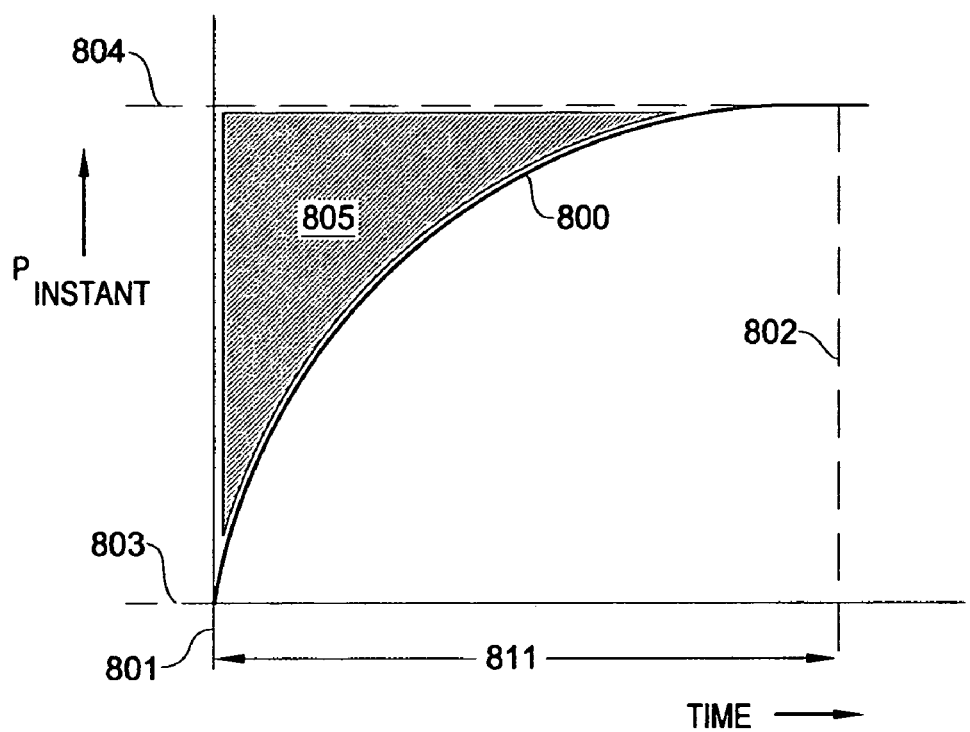
FIG. 8a is a graph of the output power of an incandescent lamp as a function of time.

In one aspect, the lamp grouping power is modified to anticipate the transient response inherent in some lamp types, such as incandescent lamps. Because the response time of an incandescent lamp may be as long as a typical RTP time step, a lamp grouping may not provide the lamp grouping power $P_{lg}$ as calculated in the process step calculation of lamp grouping powers 705 until the end of a time step, if at all. Because the RR in Equation (4) assumes a constant application of pyrometer zone power $P_p$, any transient lamp response will result in an actual power produced by the lamp grouping that is less than the desired lamp grouping power $P_{lg}$ for a given lamp grouping. This is illustrated in FIG. 8a, described below. Such a discrepancy between the desired and actual lamp grouping power $P_{lg}$ produced by a lamp grouping may result in incorrect power input to a substrate and, hence, poor tracking of substrate temperature to a desired time-temperature trajectory.

FIG. 8a is a graph of the output power of an incandescent lamp as a function 800 of time. The abscissa represents time and the ordinate represents instantaneous power generated by an incandescent lamp. Time 801 marks the beginning of an RTP time step 811 and time 802 marks the end of the RTP time step 811. The duration of the RTP time step 811 may be on the order of 0.01 seconds, which is typical for an RTP spike anneal process. At time 801, the power produced by the lamp is equal to initial lamp power 803. For RTP time step 811 the desired output power for the lamp equals target lamp power 804. The actual lamp power is illustrated by function 800. When a voltage is applied to an incandescent lamp filament, the power output of the lamp changes as the filament temperature increases, since the resistance of the filament changes as a function of temperature. Once the filament reaches thermal equilibrium, the power output of the lamp remains constant. This is illustrated in FIG. 8a. Lamp output power is only equal to target lamp power 804 near the end of the RTP time step 811, resulting in less total energy applied to the substrate than specified in the process step calculation of lamp grouping powers 705. This energy deficit is represented by the area of region 805. The magnitude of the energy deficit represented by shaded region 805 is exacerbated by longer lamp response time, shorter time steps and larger power differentials between target lamp power 804 and initial lamp power 803. In this aspect, a voltage is applied to an incandescent lamp that corresponds to an overshoot power 806 (see FIG. 8b) to ameliorate this problem. Overshoot power 806 is calculated to compensate for the energy deficit resulting from the transient lamp behavior described above in conjunction with FIG. 8a.

Figure 8B:
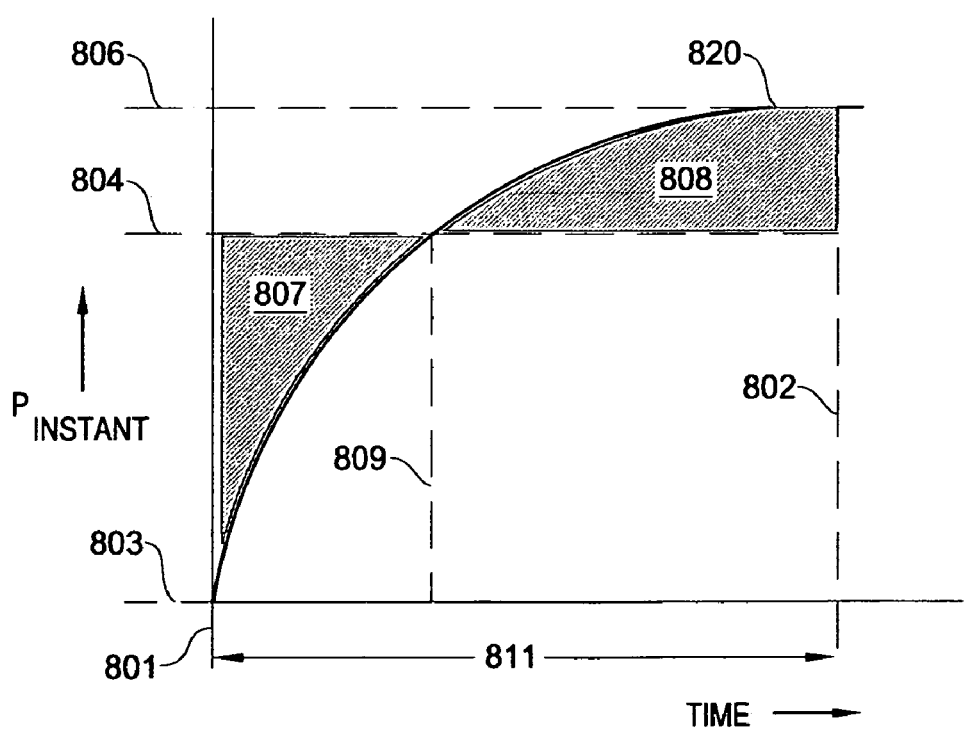
FIG. 8b is a graph of the output power of an incandescent lamp as a function of time, wherein the lamp output power is set to an overshoot power above the target lamp power.

FIG. 8b is a graph of the output power of an incandescent lamp as a function 820 of time, wherein the lamp output power is set to an overshoot power 806 above the target lamp power 804. Function 820 represents the actual power output of a lamp during RTP time step 811. Region 807 represents the difference in energy produced by the lamp between the actual lamp power, represented by function 820, and the target lamp power 804 between time 801 and time 809—in this case an energy deficit. Region 808 represents the difference in energy produced by the lamp between the actual lamp power (function 820) and the target lamp power 804 between time 809 and time 802—in this case an energy surplus. Overshoot power 806 is selected so that region 807 is equal in area to region 808. This means that the total energy produced by the lamp during RTP time step 811 is equivalent to the total energy produced by a lamp with a constant power output of target lamp power 804, i.e. a lamp with no transient response. Overshoot power 806 may be mathematically determined at each time step for each lamp grouping, for example using an iterative integration calculation of the areas of regions 807 and 808. Alternatively, overshoot power 806 may be selected from a look-up table, wherein the necessary overshoot power for a given lamp type, time step duration and change in lamp power has been previously compiled from empirical testing of the lamp.

In the next step of adaptive control method 700, heating of substrate 706, each lamp grouping generates the lamp grouping power $P_{lg}$ calculated in the previous step and the substrate is heated. As noted above, the process steps described above are then repeated for each subsequent time step in the thermal process until the desired time-temperature trajectory has been experienced by the substrate.

Figure 1:
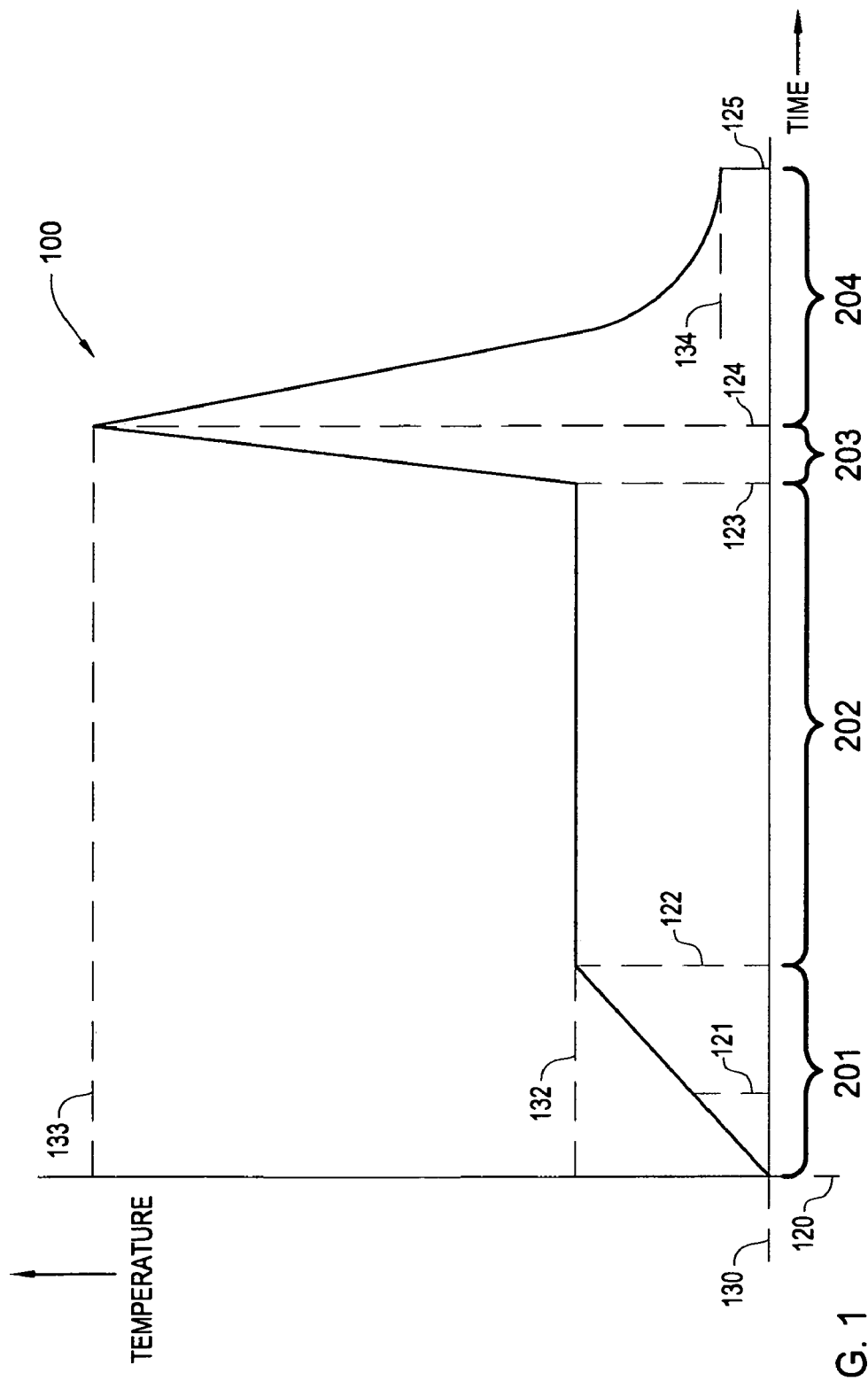
FIG. 1 (Prior Art) illustrates an ideal time-temperature trajectory for an exemplary rapid thermal process.

In one example, the adaptive control method 700 is used for closed loop control of lamps during the spike anneal segment of an RTP process, such as spike anneal 203, illustrated in FIG. 1. In another example, the adaptive control method 700 is used for closed loop control of lamps during the spike anneal 203 and the stabilization period 202 of an RTP process. In yet another example, the adaptive control method 700 is used for closed loop control of lamps during the stabilization period 202, the spike anneal 203 and the higher temperature segment of the initial temperature ramp 201.

One advantage of the adaptive control method described herein is that it allows a single controller to repeatably perform the same thermal process on different substrate types with a wide range of frontside emissivity without being re-tuned or modified. Another is that, relative to conventional model-based controllers, the adaptive control method is computationally less intensive. A third advantage is that, in addition to being able to process many types of substrates, the adaptive control method may provide an RTP process with less process variation-particularly during very short, temperature-sensitive process, such as a spike anneal process.

Binned Controller Method

In another aspect, lamp power during RTP is controlled by using a fixed control algorithm that is selected for processing a substrate based on one or more optical properties of the substrate, which may be measured in-situ during processing of the substrate. This is referred to as using a "binned" controller, wherein a number of different control algorithms have been optimized for different substrates properties and stored, or binned, in the system controller according to the value of the substrate property. For example, Table 1 presents one manner in which 10 control algorithms, each of which optimized for a different range of substrate frontside emissivity, may be binned.

the spike anneal 203 segment of the thermal process. The exemplary controllers referenced in Table one, e.g. Emis1, Emis2, etc., may be developed based on purely theoretical simulations, such as the optical models incorporated in prior art model-based controllers. Alternately, the controllers may be based on systematic empirical testing on many different substrate types, or on a combination of theoretical simulations and empirical tests.

This method may be beneficial over prior art, model-based controllers because the control algorithm selected for a given substrate may be optimized for the specific heating properties of the substrate and, hence, more accurately predict the thermal behavior of the substrate in each time step of the thermal process. In addition, the use of a "binned" controller is computationally less intensive than a method that requires a significant number of computations for each time step of the thermal process, such as the adaptive control method 700 described above in conjunction with FIG. 7. Further, the method automates the controller selection process based on one or more quantifiable criteria, allowing accurate and repeatable control of the same thermal process on a wide range of substrate types with minimal input from processing equipment operators and the associated human error.

Substrate optical properties that may serve as selection criteria for an optimal control algorithm for the substrate include frontside emissivity, absorptivity and reflectivity. Methods for directly measuring or inferring these optical properties in order to select the optimal controller for processing a given substrate are described below under Determination of Substrate Optical Properties. Compared to other optical properties of a substrate, emissivity is considered to be best suited for use as a selection criterion since it has the largest effect on the thermal behavior, i.e. heating properties, of the substrate. In another example, substrate absorptivity and/or frontside reflectivity may be included as selection criteria.

In one example of the binned controller method, a series of empirical tests are run, wherein the adaptive control method 700, described above in conjunction with FIG. 7, is used as the controller for thermally processing different substrates having many different frontside emissivities. For each frontside emissivity, the values of the slope m and intercept C of the instantaneous heating rate (see Equation 4) are recorded and tabulated in a look-up table for each temperature of the

TABLE 1

Controllers Binned According to Frontside Emissivity

| | | | | | $\epsilon_{fs}$ | | | | | |
|---|---|---|---|---|---|---|---|---|---|---|
| | 0.0–0.19 | 0.20–0.29 | 0.30–0.39 | 0.40–0.49 | 0.50–0.55 | 0.56–0.59 | 0.60–0.65 | 0.66–0.75 | 0.76–0.85 | 0.86–1.00 |
| Bin # | 1 | 2 | 3 | 4 | 5 | 6 | 7 | 8 | 9 | 10 |
| Controller | Emis1 | Emis2 | Emis3 | Emis4 | Emis5 | Emis6 | Emis7 | Emis8 | Emis9 | Emis10 |

Figure 9:
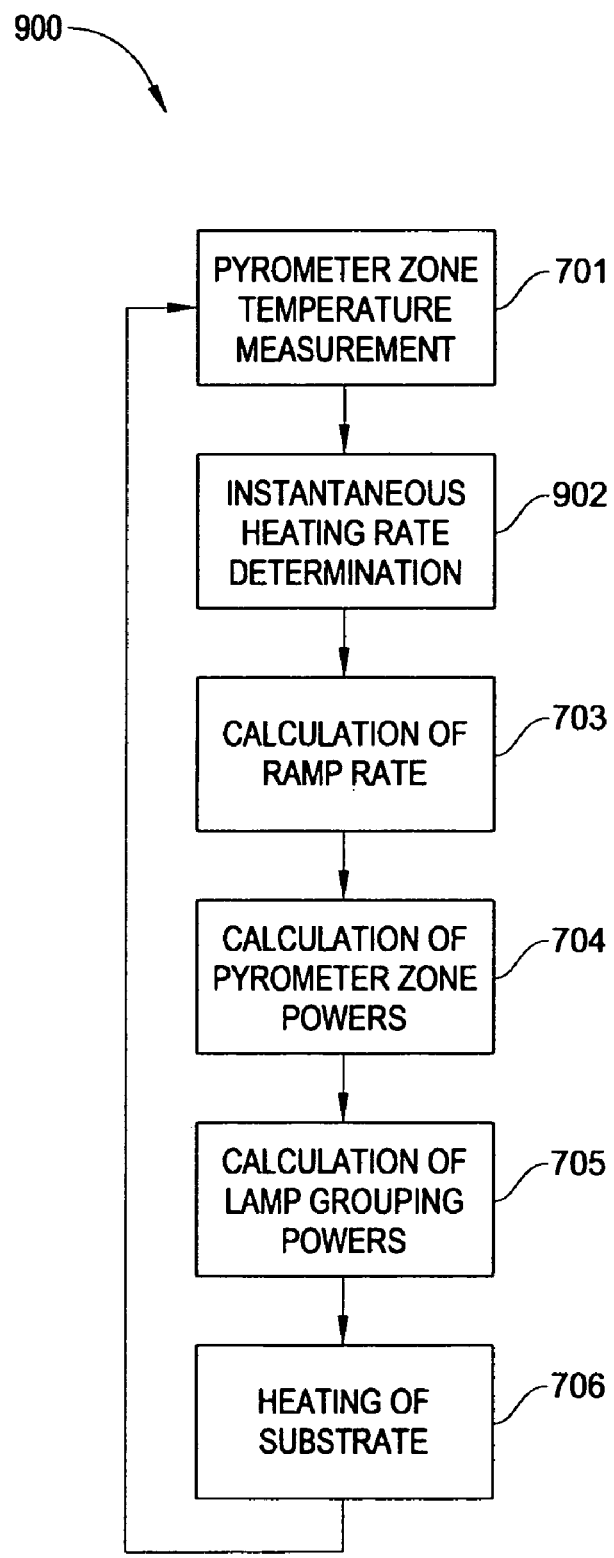
FIG. 9 illustrates a flow chart of a simplified adaptive control method that may be incorporated in the binned controller method.

The frontside emissivity referenced in Table 1 is preferably the frontside emissivity of a substrate at or near the end of the stabilization period 202, illustrated in FIG. 1. Because the emissivity of a substrate generally does not vary greatly between the temperatures of 550° C., i.e. a typical stabilization temperature, and 1100° C., i.e. a typical spike anneal temperature, the frontside emissivity of a substrate at or near the end of the stabilization period 202 may be considered substantially representative of the frontside emissivity during substrate. Subsequently, substrates may be processed using a simplified adaptive control algorithm 900, as illustrated in FIG. 9, wherein the values of slope m and intercept C are not calculated based on the heating properties of the substrate during previous time steps. Instead, slope m and intercept C for each time step are taken from the look-up table established via the empirical testing described above. FIG. 9 illustrates a flow chart of a simplified adaptive control method 900 that may be incorporated in one example of the binned controller method. With the exception of instantaneous heating rate determination 902, all other process steps of simplified adaptive control method 900 are substantially identical to the corresponding process steps described above for the adaptive control method 700 in conjunction with FIG. 7. In instantaneous heating rate determination 902, the values of slope m and intercept C in Equation (4) are taken from the look-up table based on substrate temperature and frontside emissivity.

In another example of the binned controller method, multiple versions of a prior art controller, such as a model-based controller, are developed and binned, each for a specific range of a substrate optical property, such as frontside emissivity. For example, a model-based controller may be fine-tuned for controlling a particular thermal process on a substrate whose frontside emissivity falls within a specified range, such as 0.30-0.39. This may be accomplished by tuning the empirical factors typically included in most simulation modeling programs. The optimum values thereof may be determined through empirical testing. By fine-tuning a controller for a specific range of substrate frontside emissivity, the performance of the controller is improved when processing substrates whose frontside emissivity falls within the specified range. Conversely, for substrates with frontside emissivity outside the specified range, the controller performance may be seriously reduced. Hence, when the frontside emissivity of the substrate is known, for example by using one or more of the methods described below under Determination of Substrate Optical Properties, the appropriate binned controller may be used based on the substrate frontside emissivity as described above in conjunction with Table 1.

Combined Controller Method

In another aspect, a combined method is disclosed for controlling lamp power during the thermal processing of a substrate. In this aspect the majority of lamp groupings in an RTP chamber are controlled by a computationally less intensive control algorithm, such as a controller consisting of pre-set lamp grouping powers. The remainder of the lamp groupings, which preferably consists of a small number of lamp groupings, utilizes a more sophisticated control algorithm, such as an adaptive control algorithm or a binned control algorithm. This method includes the advantages of an adaptive control method, i.e. improved accuracy of temperature control and the ability to process a wide range of substrates, without being as computationally intensive as a method wherein all lamp groupings are controlled by an adaptive control method. It may be beneficial for a control algorithm to require a minimal number of calculations during each time step to avoid overwhelming the system controller. Because the system controller is often responsible for simultaneously controlling and monitoring a large number of components and sensors throughout a substrate processing system, calculation intensive algorithms may impede its ability to perform all necessary operations timely, causing processing errors and/or delays.

In this aspect, the majority of radiant energy input to the substrate, for example on the order of about 90%, is controlled via a method that requires a relatively small amount of computing resources, and may be considered the "coarse adjustment" of substrate temperature. The remaining smaller fraction of the radiant energy input to the substrate, for example on the order of about 10%, is controlled by the more accurate, but more computationally intensive control algorithm. This may be considered the "fine adjustment" of substrate temperature and ensures that the time-temperature trajectory experienced by the substrate accurately follows the desired time-temperature trajectory even though the majority of lamp groupings are controlled by pre-set lamp powers.

Figure 10:
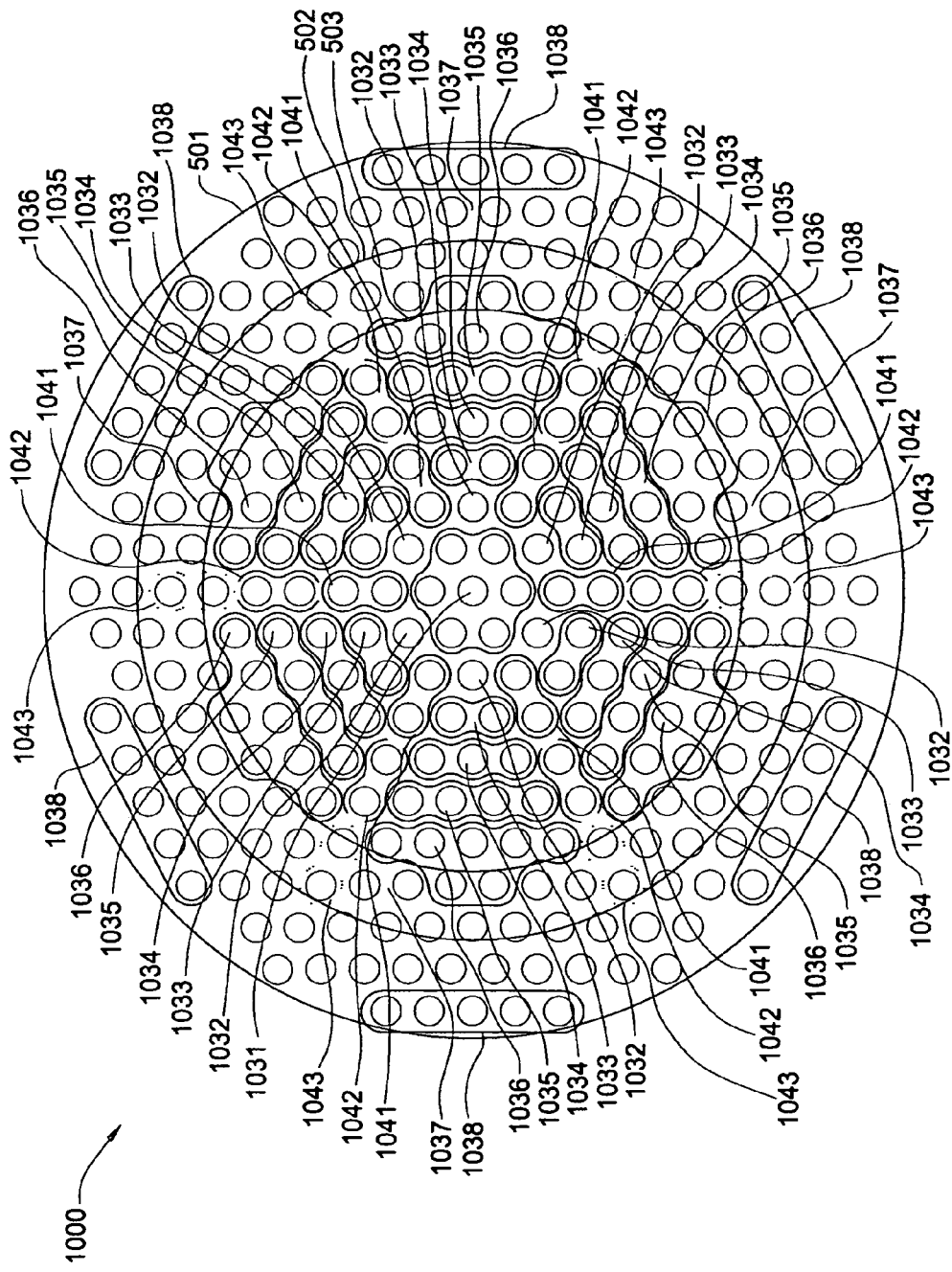
FIG. 10 illustrates one configuration of lamp groupings that may be used in conjunction with the combined controller method.

FIG. 10 illustrates one configuration 1000 of lamp groupings that may be used in conjunction with the combined controller method, wherein at least one course adjustment lamp grouping and at least one fine adjustment lamp grouping applies power to a pyrometer zone. For reference, the inner diameter 501 of an RTP chamber, the outer diameter 502 of an edge ring and the outer diameter 503 of a substrate are illustrated in relation to configuration 1000. Lamp groupings 1031-1038 are controlled using pre-set output powers for each time step of a thermal process. Lamp groupings 1041-1043 are controlled by the adaptive control method described above, by a binned controller, or by a conventional model-based controller.

An additional advantage of the combined controller method described herein is the improved signal-to-noise ratio for the lamp groupings making small adjustments in substrate temperature. Generally, when a small adjustment in substrate temperature is requested by a control algorithm for a pyrometer zone that is heated by a lamp grouping consisting of a relatively large number of lamps, precise control is often problematic. This is because the requested increase in pyrometer zone temperature may only require a very small change in output power per lamp and this change in output power may be on the order of the precision of lamp output control. For example, a requested change in output power per lamp for a lamp grouping consisting of 10 lamps is 1 W. If the accuracy of lamp output control is also on the order of 1 W, the requested change in substrate temperature may not be realized due to the inability of the large lamp grouping to respond accurately to such a small change. If the same change in total output power were requested of a lamp grouping consisting of only one lamp, the change in output power per lamp would be 10 W. This is 10 times the minimum accurate lamp output control.

Determination of Substrate Optical Properties

As noted above, during thermal processing it may be beneficial to know the current value of a substrate's optical properties, such as frontside emissivity, frontside reflectivity, absorptivity or broadband transmissivity as they change during thermal processing. This is particularly true when using a temperature control method that is not model-based, such as the adaptive control method, the binned controller method or the combined controller method described above. Aspects of the invention contemplate thermally perturbing the substrate and measuring the subsequent temperature increase of the substrate to infer one or more optical properties of the substrate. In other aspects, optical properties may be determined directly, without requiring thermal perturbation.

Frontside Emissivity of Substrate

For some thermal processes it may be beneficial to know the frontside emissivity of a substrate during the thermal process. For example, referring back to FIG. 1, in the initial temperature ramp 201 of a spike anneal process, an accurate determination of substrate frontside emissivity and transmissivity allows for closed loop control of substrate temperature to begin sooner than time 121. This minimizes unwanted thermal gradients on the substrate during initial temperature ramp 201, and, therefore, requires a shorter stabilization period 202 prior to spike anneal 203. In another example, an accurate measurement of substrate frontside emissivity immediately prior to a short duration process, such as spike anneal 203, is beneficial to temperature control. This is because the ability of the controller to predict the future temperature of the substrate and maintain the substrate at the correct time-temperature trajectory may be strongly dependent on the optical properties of the substrate. The binned controller method described above is one such case. Relying on a method that responds to past temperature error is too slow for a process of such short duration, because response time for standard lamps, such as incandescent lamps, may be as long or longer than one time step (see FIGS. 8a and 8b). Instead, an accurate method of predicting a substrate's future temperature is required. In a third example, the process of selecting the optimal control algorithm for any substrate may be automated by determining the frontside emissivity of the substrate prior to the most temperature sensitive segment of a thermal process and selecting a control algorithm accordingly.

In one aspect, the frontside emissivity of a substrate is inferred prior to a temperature sensitive segment of the thermal process, such as spike anneal 203 in FIG. 1, by applying power to one or more regions of the substrate and measuring the resulting change in temperature. In this aspect the substrate should already be at a temperature of at least about 500° C. For a standard RTP chamber, such as chamber 300 described above in conjunction with FIG. 3, this method requires no additional metrology-just the pyrometers and fiber optic probes 334 already described herein. The frontside emissivity may be determined by this method as long as the substrate is substantially opaque, i.e. its transmissivity=0, in the wavelengths measured by the pyrometers. As stated above, for a chamber using incandescent lamps, this may be wavelengths in the range of about 0.2 micrometers to about 5 micrometers. In general, substrates are substantially opaque to these wavelengths of light when at temperatures typical of stabilization period 202 prior to spike anneal 203, for example between about 500° C. and about 700° C.

The input power for any previous time step is known. The absorptivity of the substrate is a known function of substrate temperature change, input power and duration of input power. When a substrate is at thermal equilibrium, the emissivity is, by definition, equal to its absorptivity. Further, it is assumed in the art that the emissivity of a substrate is substantially equal to its absorptivity even under conditions of heating and cooling. Hence, the frontside emissivity of a substrate may be determined directly from the temperature change of a substrate, as long as the assumptions are correct that the substrate is essentially opaque and that the frontside emissivity is substantially equal to the absorptivity of the substrate. The latter assumption is most accurate when the substrate is relatively close to thermal equilibrium, i.e. when the substrate is increasing or decreasing in temperature relatively slowly. In this aspect, the input power is preferably applied to one or more zones of the substrate at a time when the substrate is at thermal equilibrium, for example during stabilization period 202. It is also preferable that the duration of the input power applied to the one or more pyrometer zones is longer than the thermal response time of the substrate. For example, for a given magnitude of increased power input P1 above the input power required to maintain the substrate at its current temperature, the time required for the substrate to appreciably increase in temperature may be on the order of 0.1 seconds. Hence, the preferred duration of increased power input to the substrate may be on the order of 0.2 seconds or longer when the magnitude of the power input is roughly equal to P1. This ensures a measurable response in the temperature of the substrate, allowing the calculation of the absorptivity and emissivity. In one example, the duration of increased power input P1 is variable; increased power input P1 is applied to the one or more pyrometers zones of the substrate until the temperature in the pyrometer zones increases a pre-determined amount.

If desired, the frontside reflectivity of the substrate may also be determined for any time step of a thermal process with this aspect. Because the transmissivity of the substrate may be assumed to be substantially equal to 0, frontside reflectivity of the substrate may be determined by simplifying Equation (5) to Equation (5a):

$$A + T + R = 1.0 \tag{5}$$

$$R = 1.0 - A \tag{5a}$$

where:
A=the absorptivity of a pyrometer zone for radiation of wavelength 0.2 µm to 5 µm during a time step;
T=the transmissivity of a pyrometer zone for radiation of wavelength 0.2 µm to 5 µm during a time step; and
R=the frontside reflectivity of a pyrometer zone for radiation of wavelength 0.2 µm to 5 µm during the time step.

This method may be used to determine frontside emissivity and reflectivity during a period of relatively constant substrate temperature, such as stabilization period 202 and/or it may be used as a real-time emissivity/reflectivity calculation while the substrate temperature is changing rapidly, such as during spike anneal 203. For the latter scenario, it may be necessary for a high sensor sampling rate, e.g. into the kHz range, as well as a high lamp control frequency. Because the control frequency of incandescent lamps is on the order of about 100 Hz, a different lamp type may be required. It may also be necessary to have a system controller with adequate computational resources to control the most sensitive segment of the thermal process while performing the additional calculations for emissivity for each time step. For these reasons, the in-situ measurement of frontside emissivity may be most beneficial when conducted during a period immediately prior to a spike anneal process, for example during a stabilization period 202, rather than during the spike anneal process. Because the emissivity generally does not change substantially for substrates between about 500° C. and about 1000° C., a spike anneal process may be accurately controlled based on the values of frontside emissivity and frontside reflectivity that are measured during the preceding stabilization period 202.

In another aspect, the frontside emissivity of a substrate is inferred when the substrate is at a relatively low temperature by applying a power input to one or more regions of the substrate as a waveform, i.e. as an oscillating function. The power input waveform makes possible the measurement of the substrate's current transmissivity, which in turn allows the calculation of the substrate's actual temperature. Substrate absorptivity and frontside emissivity may be determined from the substrate temperature increase. Frontside reflectivity may then be calculated, if desired, as described above in conjunction with Equation (5a).

When a substrate is at a temperature of about 500° C. or more, a pyrometer may determine the temperature of the substrate by measuring light emitted from the backside of the substrate. As noted above in conjunction with FIG. 1, substrates that are less than about 300° C. to about 400° C. are substantially transparent to the wavelengths of radiation produced by commonly used lamps. Because of this, at lower temperatures a conventional pyrometer will detect any light from the lamps that is transmitted by the substrate in addition to light emitted by the backside of the substrate, resulting in a highly inaccurate temperature measurement of the substrate.

Hence, open loop control, wherein no substrate temperature feedback is incorporated into controlling the thermal process, is generally preferred for thermal processing until a substrate is at a high enough temperature to be largely opaque to lamp radiation. This aspect allows closed loop control to be used much earlier in the process by determining substrate transmissivity and frontside emissivity at lower temperatures, for example as low as about 250° C. For example, in the initial temperature ramp 201 (illustrated in FIG. 1) of a spike anneal process, an accurate determination of substrate frontside emissivity and transmissivity allows for closed loop control of substrate temperature to begin sooner than time 121. This minimizes unwanted thermal gradients imprinted on the substrate during initial temperature ramp 201, and, therefore, requires a shorter stabilization period 202 prior to spike anneal 203.

Figure 11:
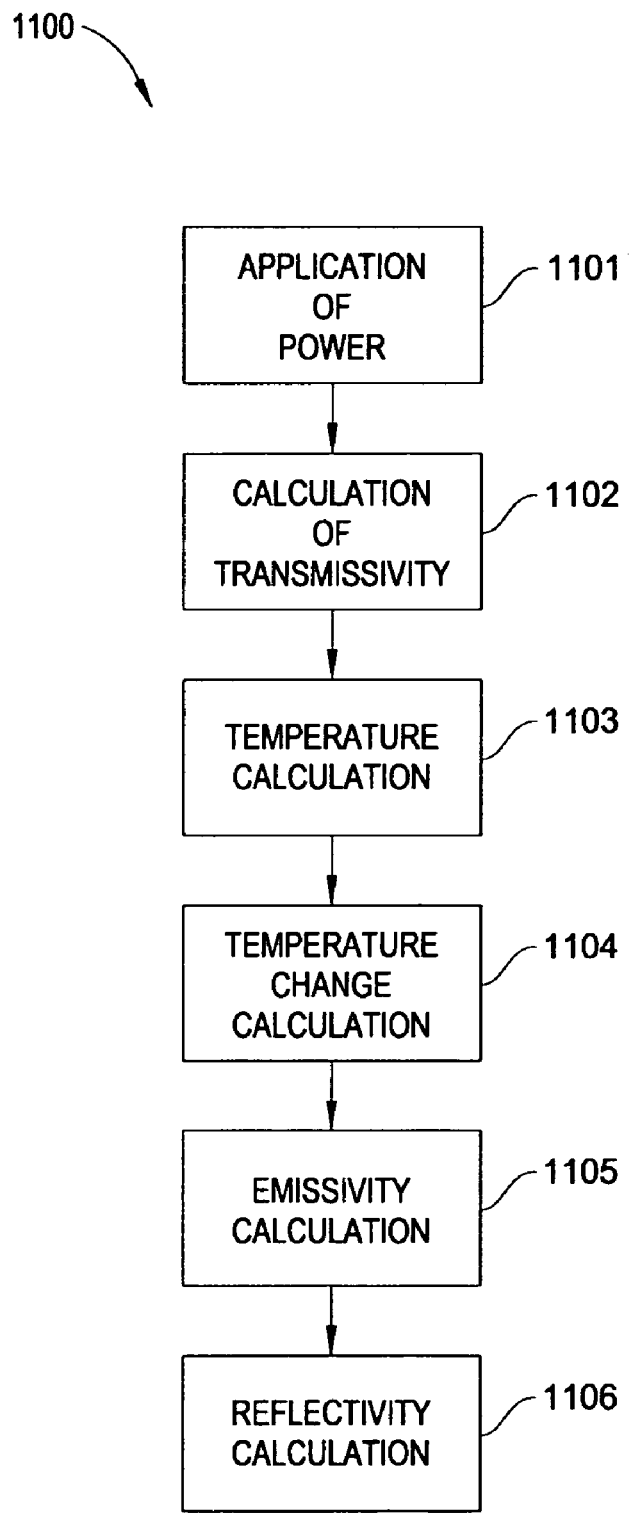
FIG. 11 is a flow chart illustrating a process sequence for one aspect of the invention.

FIG. 11 is a flow chart illustrating a process sequence 1100 for this aspect of the invention. Because the frontside emissivity and especially the transmissivity of substrates change significantly as a function of temperature, it is important that the value of these optical properties be updated frequently when used to control substrate temperature. In one example, process sequence 1100 takes place continuously throughout the thermal processing of a substrate. In another example, process sequence 1100 takes place periodically during the thermal processing of a substrate, for example once each second, and the transmissivity and frontside emissivity are updated accordingly. Further, this aspect may be used throughout an entire thermal process or only during specific segments of a thermal process, such as the initial temperature ramp 201 and the stabilization period 202, illustrated in FIG. 1. This aspect may be most beneficial during initial temperature ramp 201 and stabilization period 202 since substrate transmissivity is generally=0 at temperatures >700° C. and frontside emissivity only varies slightly at temperatures greater than about 700° C.

Referring back to FIG. 11, in the first process step, application of power 1101, power is applied to the substrate in an oscillating function, or waveform. The oscillating function may be a sinusoidal function, a square wave, a sawtooth wave, or other waveform of a known magnitude and frequency. Preferably, the frequency and magnitude of the oscillating function are constant. Further, it is preferred that the frequency of the oscillating function is substantially higher than the thermal response time of the substrate but no higher than the pyrometer sampling rate. For example, for a given magnitude of power input, P2, the time required for the substrate to appreciably increase in temperature may be on the order of 0.1 seconds. The sampling rate of a pyrometer monitoring the substrate temperature may be on the order of 0.001 seconds. Hence, the preferred frequency of the oscillating power input may be on the order of 0.01 seconds when the magnitude of the power input is roughly equal to P2. In so doing, the fraction of radiant power that penetrates the substrate, i.e., the transmissivity, may be determined by comparing the magnitude of the input power waveform from the lamps to the magnitude of the transmitted power waveform detected by the pyrometer. The magnitude of the transmitted power waveform is directly proportional to the transmissivity of the substrate.

In one example, during the process step application of power 1101 the power input waveform is applied to every pyrometer zone of the substrate and transmissivity of each pyrometer zone is determined directly as described above. In another example, in the interest of using fewer calculations per time step, the transmissivity is not determined for all pyrometer zones. Because the temperature differences across a substrate during a time step are generally too small to create significant differences in transmissivity across the substrate, the transmissivity may be assumed to be constant across the substrate during any give time step. Hence, the transmissivity may only be determined for a single pyrometer zone of the substrate and it may be assumed that the transmissivity for one pyrometer zone is substantially representative of the entire substrate. In another example, the transmissivity of alternating pyrometer zones is determined via the method described above in conjunction with application of power 1101 and the transmissivity of the pyrometer zones therebetween is interpolated from that of the measured pyrometer zones.

In the next process step, calculation of transmissivity 1102, the control algorithm calculates the transmissivity for the pyrometer zone or zones for this time step of the thermal process. This calculation is based on the information obtained in application of power 1101.

In the next process step, temperature calculation 1103, the control algorithm calculates the actual temperature of all pyrometer zones of the substrate for the time step by factoring in the transmissivity of the substrate and the magnitude of the input power from the lamp for the time step.

In the next process step, temperature change calculation 1104, the control algorithm calculates the temperature change of all pyrometer zones of the substrate between this time step and the previous time step in the thermal process.

In the next process step, emissivity calculation 1105, frontside emissivity of each pyrometer zone of the substrate is assumed to be substantially equal to substrate absorptivity. Absorptivity is a known function of substrate temperature change, input power and time step duration, as described above for determining frontside emissivity for a higher temperature substrate.

Optionally, in the next process step, reflectivity calculation 1106, frontside reflectivity may be determined as described above in conjunction with Equations (5) and (5a).

This aspect allows closed-loop control of substrate temperature at lower temperatures and, hence, earlier in a thermal process. This may result in shorter required stabilization periods and more uniform substrate temperatures. This method also makes possible the thermal processing of a substrate that is not entirely opaque to radiant energy while maintaining low temperature non-uniformity throughout the thermal process. The apparatus for conventional pyrometry may be used to control the process.

In another aspect, substrate frontside emissivity may be inferred during processing based on how a controller has responded earlier in a thermal process to compensate for the difference in emissivity between a substrate and the edge ring, such as edge ring 331, illustrated in FIG. 3. Since this method relies on the behavior of the control algorithm averaged over a relatively long period of time, for example five to ten seconds or more, this method is best suited for determining frontside emissivity of a substrate immediately prior to a spike anneal process or other temperature sensitive process. This aspect may be used in conjunction with any closed loop control method that is able to respond to the "edge ring effect" (described below in conjunction with FIG. 3 and FIGS. 12A-12C) by varying the power output to peripheral lamp groupings. Examples of closed loop control methods compatible with this aspect include the adaptive control method described and the binned controller method, both of which are described herein.

Referring back to FIG. 3, edge ring 331 supports the substrate during RTP in chamber 300. Edge ring 331 is generally adapted to be very thin in order to minimize its ability to conduct heat to or from regions of the substrate contacting edge ring 331. But the effect of the edge ring 331 on the substrate temperature is not limited to conductive heat transfer. Whenever the emissivity of the edge ring 331 is different from the frontside emissivity of the substrate, the edge ring 331 may act as a significant heat source or heat sink for the edge region of the substrate via conductive and/or radiant heat transfer. For example, for a highly reflective substrate, i.e., a substrate having a lower substrate emissivity and absorptivity than that of the edge ring, the edge ring will act as a heat source for the substrate since it is absorbing radiant energy more quickly than the substrate. When a high absorbing, high emissivity substrate is processed in the same chamber 300, the converse is true and the edge ring acts as a heat sink. This effect, hereinafter referred to as the "edge ring effect", is directly dependent on the difference in emissivity between the edge ring 331 and the substrate being processed.

Ordinarily, when the different power outputs of the lamp groupings are not fixed with respect to each other, i.e. they are controlled independently, the lamp groupings will consistently demonstrate a similar power profile, also known as a lamp curve, for a given value of substrate frontside emissivity. A power profile, as used herein, is defined as a graph illustrating the average lamp power, i.e. the power output of an individual representative lamp, for each lamp grouping in an RTP chamber. The repeatable demonstration of a similar power profile is driven by the difference in emissivity between the edge ring and the substrate's front side. For example, when the substrate emissivity is approximately equal to the emissivity of the edge ring, the individual lamp powers demanded by the control algorithm are largely uniform between lamp groupings. This is because the edge ring does not act as either a significant heat source or heat sink during RTP. When the substrate emissivity is substantially lower than that of the edge ring, the lamp power in the outer lamp groupings drops below the lamp power of the interior lamp groupings, since the edge ring is acting as a heat source for the substrate edge. Conversely, when the substrate emissivity is substantially higher than that of the edge ring, the lamp power in the outer lamp groupings are higher than the lamp power of the interior lamp groupings, since the edge ring is acting as a heat source for the substrate edge. These three scenarios are illustrated in FIGS. 12A-12C.

Figure 12A:
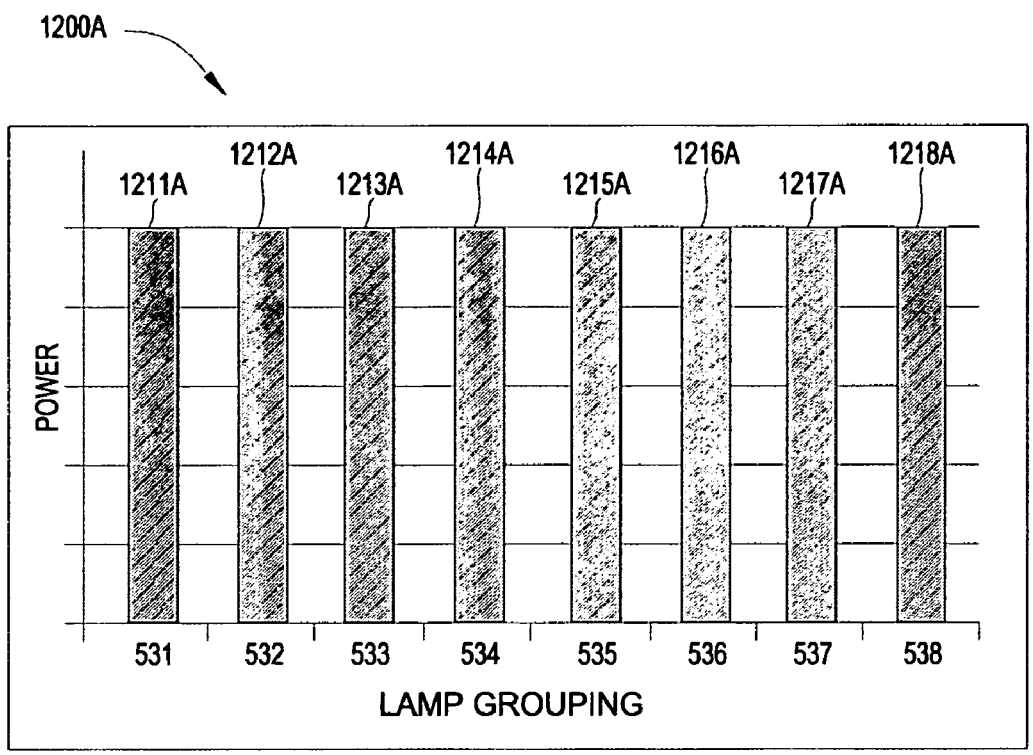
FIGS. 12A-12C illustrate power profiles for an RTP chamber containing eight lamp groupings.
Figure 12B:
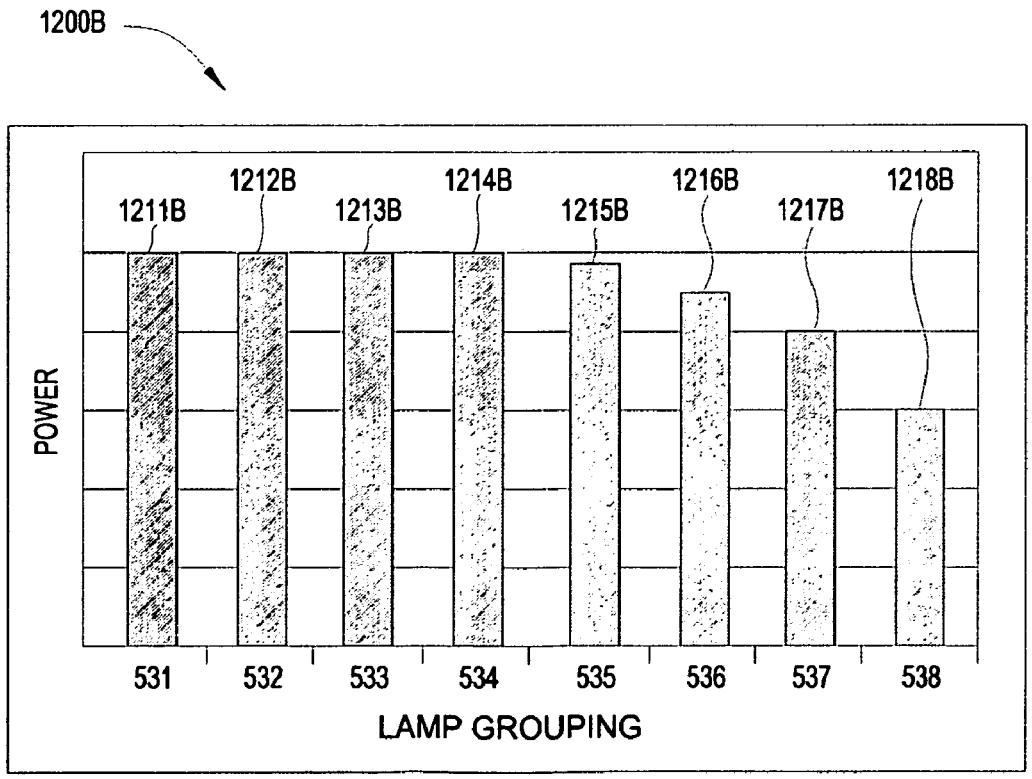
Figure 12C:
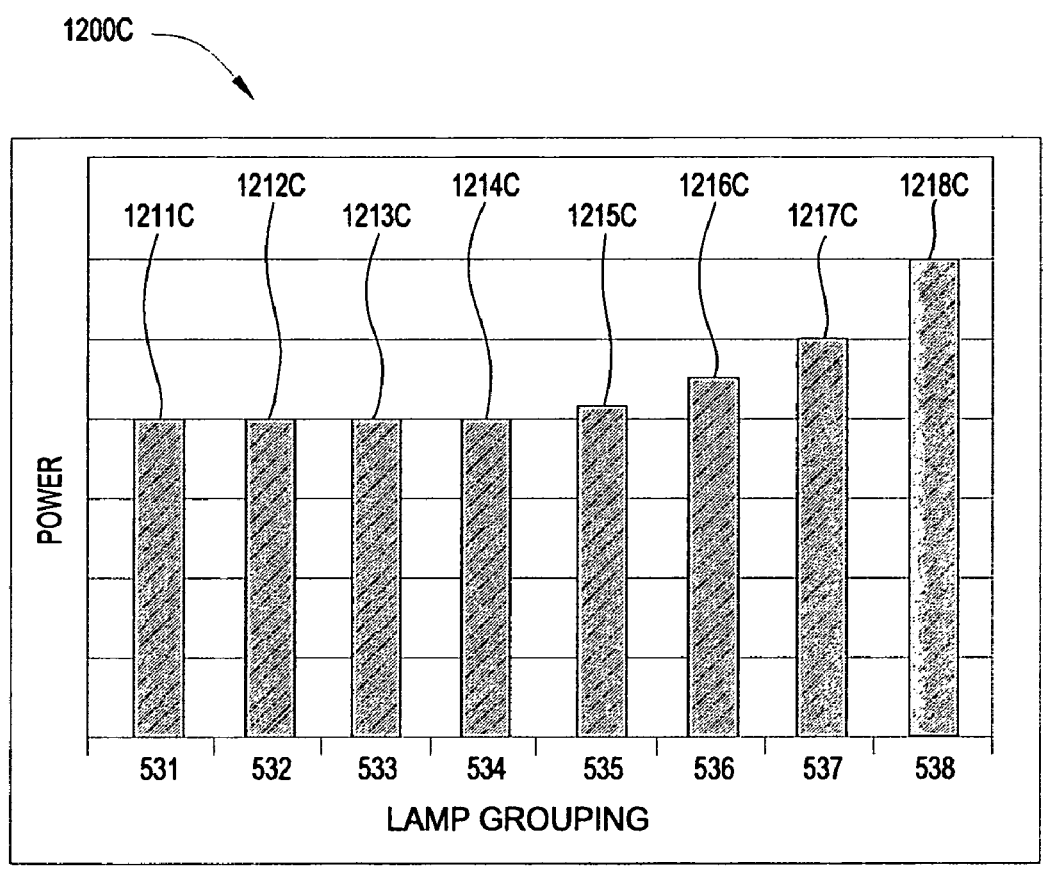

FIGS. 12A-12C illustrate the power profiles for an RTP chamber, such as chamber 300, containing eight lamp groupings. Individual lamp powers are used for comparison of the different lamp groupings instead of total power for each lamp grouping because lamp groupings generally do not treat the same total surface area of a substrate. The lamp power for each lamp grouping may be averaged over an entire RTP process or just over a temperature-sensitive segment of an RTP process, such as the spike anneal segment.

FIG. 12A illustrates a power profile 1200A for an RTP chamber processing a substrate with a frontside emissivity approximately equal to that of the edge ring. Power profile 1200A includes the lamp powers 1211A-1218A, for all eight lamp groupings 531-538 during a spike anneal segment of an RTP process, such as spike anneal 203. Each of the lamp powers 1211A-1218A represents the average output power over the duration of spike anneal step 203. In some cases, due to gas flow and wall reflectivity effects, lamp powers 1211A-1218A may not in reality be exactly equal to each other as shown for illustrative purposes in FIG. 12A, but will nonetheless evince a known and reproducible profile substantially free of the "edge ring" effect. In any event, because the edge ring does not act as a significant heat source or heat sink, the lamp powers for each lamp grouping near the periphery of the substrate are largely uniform with respect to each other as illustrated in FIG. 12A.

FIG. 12B illustrates a power profile 1200B for an RTP chamber processing a substrate with a frontside emissivity significantly less than that of the edge ring. Power profile 1200B includes the lamp powers 1211B-1218B, for all eight lamp groupings 531-538, each averaged over the duration of a spike anneal segment of an RTP process. Because the edge ring acts as a significant heat source, the lamp powers near the edge of the substrate drop. This is an empirical indicator of how the control algorithm for the RTP chamber is compensating for the edge ring effect.

FIG. 12C illustrates a power profile 1200C for an RTP chamber processing a substrate with a frontside emissivity significantly greater than that of the edge ring. Power profile 1200C includes the lamp powers 1211C-1218C, for all eight lamp groupings 531-538, each averaged over the duration of a spike anneal segment of an RTP process. Because the edge ring acts as a significant heat sink, the lamp powers near the edge of the substrate are higher than those for the central lamp groupings. As with FIG. 12B, this is an empirical indicator of how the control algorithm for the RTP chamber is compensating for the edge ring effect.

Because the behavior of the power profile is a predictable and repeatable function of substrate frontside emissivity, this information may be used to empirically infer the frontside emissivity of a substrate while it is in-situ during thermal processing. The invention contemplates inferring the frontside emissivity of a substrate in the early stages of a thermal process, for example during the initial temperature ramp 201 of the spike anneal process, illustrated in FIG. 1. The frontside emissivity is selected by comparing the measured power profile of the substrate to a suite of empirically determined, "binned" power profiles corresponding to different values of substrate frontside emissivity. In one example of this aspect, when the measured power profile falls substantially equally between two binned power profiles, the value of frontside emissivity is interpolated between them.

This aspect allows selection of an optimal controller for thermal processing based on experiential information. That is, the recorded behavior of the control algorithm, i.e. the power profile, may indicate the frontside emissivity of the substrate based on a correlation to empirical test data for a particular chamber. No additional modeling or correction factors are necessary for the accurate determination of frontside emissivity since a power profile is based on the thermal behavior of a particular substrate in a particular chamber. Also, a large number of additional calculations in each time step of the thermal process is not necessary for determining frontside emissivity; a power profile is taken directly from recorded data and may be correlated to a corresponding emissivity immediately prior to a temperature sensitive step of a thermal process.

Transmissivity of Substrate

As noted above, it may be beneficial to know the transmissivity of a substrate during a thermal process. This is particularly true at lower temperatures, i.e. below 400° C., when substrate transmissivity may vary substantially with temperature. One method contemplated by the invention for calculating the transmissivity of a substrate has been described above in conjunction with FIG. 11. Two further methods are disclosed herein wherein the transmissivity of a substrate is determined at temperatures below 400° C.

In one aspect, the transmissivity as well as the other optical properties of a substrate are determined with a 2-channel pyrometry method for each pyrometer zone of the substrate. Referring back to FIG. 3, the light from each fiber optic probe 334 is split into 2 optical paths, wherein one path is directed to a first pyrometer that measures light frequencies emitted from the substrate backside normally, i.e. wavelengths below the bandgap of a silicon substrate, wavelengths less than about 1 μm, for example. This pyrometer may be equivalent to a standard RTP pyrometer. The light from the second optical path is directed to a second pyrometer measuring light at longer wavelengths and, hence, substantially lower energy than the bandgap energy of a typical substrate.

The bandgap for a semiconductor, such as a perfect silicon crystal contained in a typical RTP substrate, is defined as the energy difference between the top of the valence band and the bottom of the conduction band. In order for incident light to be absorbed as heat energy by the semiconductor, i.e. to be energetic enough to promote an electron from the valence shell to the conduction shell, the energy of the incident radiation must be above the semiconductor's bandgap. Below the bandgap, where incident light is of a short enough wavelength and high enough energy, all light is completely absorbed or reflected by the semiconductor—none is transmitted. However, the bandgap for any material varies with temperature—with increasing material temperature, lower energy (i.e. longer wavelength) light is absorbed as heat energy by the semiconductor material. In addition, at higher temperatures, more electrons are available to absorb incident light energy that do not have the minimum bandgap energy requirement and therefore may also absorb longer frequency light energy. Largely due to these two energy-absorption mechanisms, a typical RTP substrate may range from almost 100% transmissivity of incident lamp radiation at the start of an RTP process to 0% transmissivity during later stages of an RTP process.

Standard pyrometers used for RTP applications measure light at wavelengths that are completely absorbed at the most critical process temperatures during RTP, e.g. greater than about 500° C. These wavelengths are in range of about 0.2 μm to about 3 μm. At lower temperatures, such as at 20° C., these wavelengths of light are above the bandgap of a silicon crystal and therefore are almost entirely transmitted through the substrate. The second pyrometer, described above, may be filtered to detect light at a slightly longer wavelength than the first pyrometer, in particular, light in the neighborhood of the silicon band gap at the substrate temperatures of interest or somewhat longer. In so doing, as the substrate increases in temperature, its transmissivity in the range of about 0.2 μm to about 3 μm may be determined. As described above in conjunction with FIG. 11 and Equations (5) and (5a), when the transmissivity of a substrate, the input power during a time step and the associated temperature increase during the time step are all known, the remaining optical properties of a substrate may then be calculated and/or inferred, including: absorptivity, frontside emissivity and frontside reflectivity.

In another aspect, transmissivity of the substrate is determined via methods based on the temperature dependence of the bandgap of the substrate material, using either a spectrometer or transmission pyrometer.

In one example, a spectrometer may be used to analyze the spectral emissions of a substrate during thermal processing at temperatures below about 400° C. A near infra-red spectrometer, such as an indium-galium-arsenide (InGaAs) diode photodetector, may be used for this method. Referring back to FIG. 3, a spectrometer 337 may be optically attached to one or more of the fiber optic probes 334 directed at the backside of a substrate during thermal processing. For a given bandpath, i.e. the spectrum of wavelengths between two selected wavelengths, the spectral profile of energy that is transmitted through the substrate at low temperatures, e.g. less than about 100° C., may be measured by the spectrometer and recorded. As the substrate increases in temperature and its transmissivity changes, a second spectral profile of substrate emissions in the selected bandpath is measured by the spectrometer. By analyzing the differences between the two spectral profiles, the transmissivity of the substrate at its current temperature may be determined based on how much total energy is being absorbed by the substrate. The bandpath of interest for spectral analysis may include wavelengths in the range of about 1.0 μm to about 1.5 μm or in the wider range of about 900 nm to about 2.2 μm. In some instances, the bandpath for spectral analysis includes wavelengths in the range of about 0.2 μm to about 3.0 μm. As described above in conjunction with FIG. 11 and Equations (5) and (5a), when the transmissivity of a substrate, the input power during a time step and the associated temperature increase during the time step are all known, the remaining optical properties of a substrate may then be calculated and/or inferred. With a reliable method of measuring substrate temperature when a substrate is below 400° C., closed-loop control may be used earlier in a thermal process to control the substrate heating. This minimizes thermal gradients on the substrate caused by open-loop control which shortens the time required for thermal stabilization prior to spike anneal and prevents significant deformation of the substrate prior to closed loop control.

In one case, spectral analysis of substrate emissions and determination of transmissivity is conducted for each pyrometer zone of a substrate for each time step of a thermal process below about 500° C. In another case, spectral analysis and transmissivity determination are only carried out for a single pyrometer zone and all other zones are assumed to have approximately the same transmissivity. In another case, spectral analysis is conducted on alternating pyrometer zones and the transmissivity of the remaining pyrometer zones is interpolated from the adjacent pyrometer zones.

In another example of determining transmissivity at lower temperatures, a method may be used known as almost room temperature pyrometry (ART), wherein the temperature of the substrate may be inferred due to the temperature-dependence of the bandgap of the substrate material.

ART uses one or more transmission pyrometers to infer the temperature of the substrate during lower temperature processing, e.g. less than 500° C., based on the substrate's transmissivity. A transmission pyrometer detects the optical radiation from the radiant heating lamps as it is filtered by the silicon substrate. The absorption of the silicon in some wavelength bands, i.e. the transmissivity of silicon, strongly depends upon the substrate temperature. A correlation between the signal output of a transmission pyrometer for a substrate at different temperatures and lamp outputs may be drawn based on empirical testing prior to substrate processing. Once this correlation is quantified, the substrate temperature may be inferred from the pyrometer output signal, or photocurrent, and the lamp output power at any time during low temperature processing.

Transmission pyrometry may be performed when the general relationships are known between radiant power delivered by the radiant heating lamp or other electrical characteristics thereof, the substrate temperature, and the photocurrent of the transmission pyrometer. In one method of compiling these characteristic relationships between photocurrent, substrate temperature and lamp output, a two-dimension table may be filled with the unnormalized, i.e. uncorrected, photocurrent as a function of substrate and lamp temperature via empirical testing. The tabulated data establish the dependence of the transmission pyrometer photocurrent upon lamp current and substrate temperature for a baseline condition. The required lamp and substrate characteristics may be established in a number of ways. It is possible to measure the pyrometer photocurrent for a large number of combinations of lamp current and substrate temperature—and possibly substrate thickness—and use these experimental values to thereafter relate photocurrent to substrate temperature. Generally, it is preferred that a scaling factor, also known as a normalizing factor, be applied to the tabulated experimental data for each substrate processed in order to account for variations in substrate optical properties and for changes in chamber conditions, such as different lamps, etc. The scaling factor, or normalizing factor, is determined in a calibration step, described in conjunction with FIG. 12E, below. Thereafter, when processing a substrate, an initial measurement of the photocurrent at a known temperature of the substrate allows the tabular data to be scaled with an appropriate normalization factor for the particular substrate being processed. The initial measurement of the substrate is taken at the beginning of the thermal process and before the substrate has been heated. During subsequent thermal processing of the substrate, when the pyrometer photocurrent is measured at a known lamp temperature or resistance, the normalized table is consulted to obtain the corresponding substrate temperature.

A transmission pyrometer's filter and photodetector together provide a spectral response sensitive to the wavelength of the absorption gap at the substrate temperatures of interest, e.g., 200-450° C. or 100° C. to 250° C. The particular photodetector used therein may be a silicon photodetector for temperatures below about 350° C. since the absorption gap of silicon varies from about 1 µm to about 1.2 µm for temperatures from room temperature to 350° C.; a silicon photodetector is insensitive to radiation having a wavelength greater than about 1.1 µm. For temperatures higher than about 350° C., the absorption edge is beyond the detection limits of the silicon photodetector so that any further increases in the absorption edge wavelength are not readily detected. Thus, for operation with higher substrate temperatures, it is desired to use a photodetector sensitive to longer wavelengths. An example of such a detector is an InGaAs diode photodetector, which has a detection band between about 0.9 and 1.7 µm.

Figure 12D:
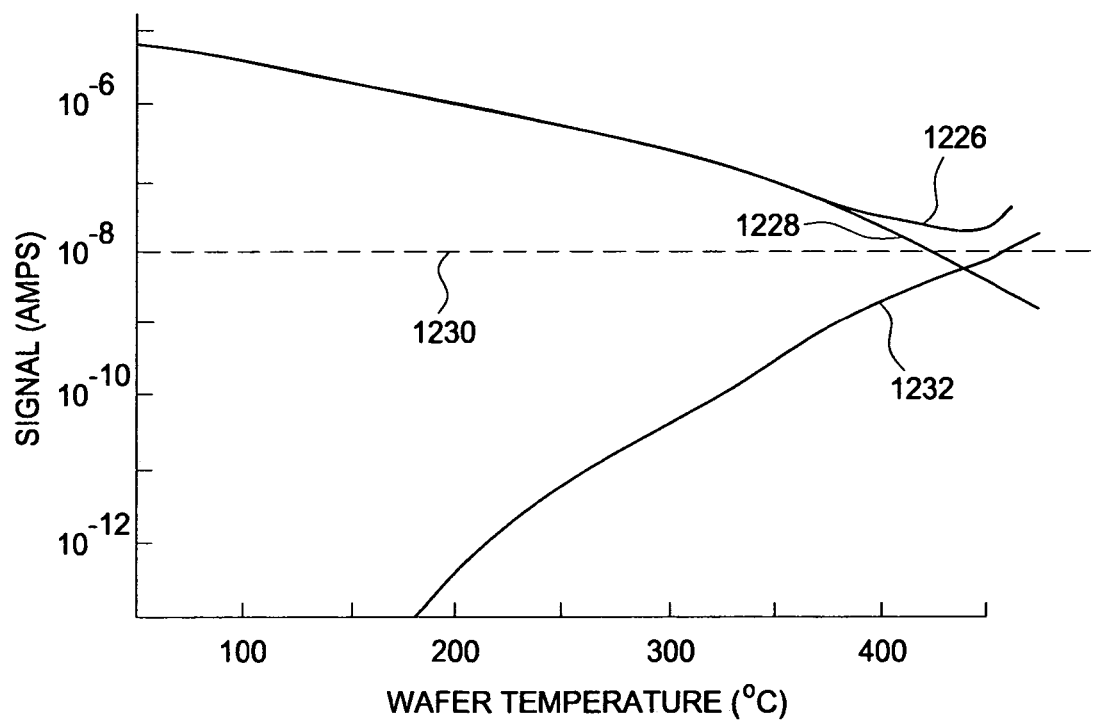
FIG. 12D graphically illustrates the temperature regime of operation for ART.

The temperature regime of operation for ART is described in reference to the graph of FIG. 12D. Line 1226 represents the total photocurrent from the transmission pyrometer as a function of substrate temperature for one setting of the lamp current. At lower temperatures, the total photocurrent is principally a photocurrent 1228 arising from the photon flux from the warm lamps and passing through the substrate. However, as represented by line 1230, there is a constant background radiation, e.g. stray radiation and warm chamber parts. At higher temperatures, there is an increasing contribution from the blackbody radiation of the substrate itself, represented by line 1232. The cross over for the lamp and substrate blackbody contributions occurs at a temperature of about 400° C., which is near the lower end of the region at which a radiation pyrometer becomes effective.

Figure 12E:
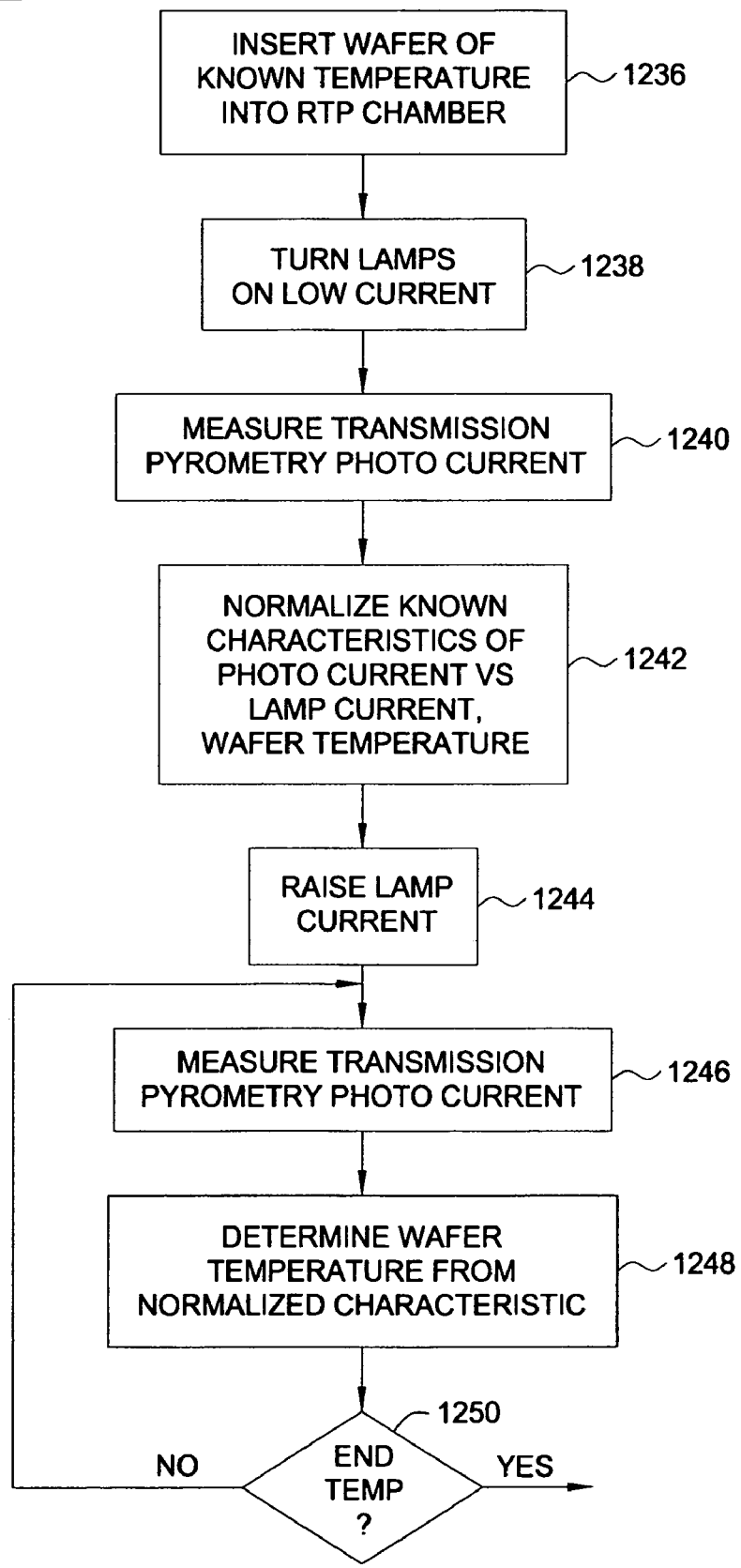
FIG. 12E illustrates a process flow diagram for controllable heating of a substrate using ART.

A basic algorithm for a controllable heating of the substrate is illustrated in the process flow diagram of FIG. 12E. In step 1236, a substrate of known temperature is inserted into the RTP chamber and in step 1238 the lamps are turned to a set low current, for example, about 20% of the maximum lamp current. In step 1240, the photocurrent from the transmission pyrometer is measured before the substrate has time to significantly warm in the lamp radiation. This measurement is done with known values of the lamp current and substrate temperature and enables the known characteristics to be properly normalized/corrected with the appropriate scaling factor. In step 1242, the known but unnormalized values of the characteristics of photocurrent vs. lamp and substrate temperature are normalized with the scaling factor determined in the calibration step. In step 1244, the lamp current is raised to at least an initial pre-heat value. In step 1246, the photocurrent from the transmission pyrometer is measured for the same substrate and the raised lamp current. In step 148, the substrate temperature may be determined by comparing the measured photocurrent and lamp power to the appropriately scaled tabular data of photocurrent as a function of substrate and lamp temperature. Steps 1246 and 1248 are repeated until it is determined in step 1250 that some final pre-heat substrate temperature has been reached.

A more detailed description of ART methods and apparatus that may be contained in some configurations of the invention may be found in commonly assigned U.S. patent application Ser. No. 10/974,003 [9376], entitled "Method and Apparatus for Low Temperature Pyrometry Useful for Thermally Processing Silicon Wafers," filed on Oct. 26, 2004, which is hereby incorporated by reference in its entirety to the extent not inconsistent with the claimed invention.

This aspect of the invention allows application of a well-controlled thermal process for a range of substrate types using the same control algorithm. Although different substrate types may have widely different bandgaps and transmissivity at lower temperatures, this aspect, through the early introduction of closed-loop control, avoids the need to customize a different controller for each different substrate type for the same thermal process. Also, because the cross-over from partial transparency to complete opacity occurs at different temperatures for each substrate type, the use of open loop control requires a longer stabilization period than may be necessary. With closed loop control available earlier in a thermal process, temperature non-uniformity may be improved and the overall duration of the thermal process reduced. In one example, the adaptive control method or the binned controller method, previously described herein, may be used in conjunction with this aspect. Further, this aspect may make possible the reliable, repeatable thermal processing of substrates at lower temperatures, e.g. <400° C.

In addition to allowing determination of substrate temperatures below 400° C. and, therefore, closed loop control at these temperatures, aspects of the invention that determine substrate transmissivity at relatively low temperature may also be used to quantify an influence matrix of lamp groupings as a substrate is being processed. This may occur relatively early in a thermal process, for example during the initial temperature ramp 201 described above in conjunction with FIGS. 1 and 2. Rather than ramping substrate temperature continually during this segment of the thermal process, a portion of this time may be dedicated to cycling each lamp grouping sequentially for a short time. Since the true temperature of each pyrometer zone of the substrate is known and the magnitude and duration of power input are also known, the proportional influence of each lamp grouping on all pyrometer zones may be quantified early in the thermal process. An accurately quantified influence matrix may be beneficial to other aspects of the invention, such as the adaptive control method—described above in conjunction with FIG. 7.

Frontside Reflectivity of Substrate

In some instances, it may be beneficial to know the frontside reflectivity of a substrate during a thermal process. For example, in lieu of assuming that the absorptivity of a substrate is approximately equal to the frontside emissivity, the absorptivity of a substrate may be solved for directly with Equation (5a) when frontside reflectivity is known. Because the frontside reflectivity and absorptivity of a substrate strongly effect the thermal behavior of a substrate during thermal processing, accurate values for these optical properties may be used as selection criteria for a previously optimized control algorithm or algorithms as described above in conjunction with Table 1. Some methods contemplated by the invention for calculating the frontside reflectivity of a substrate have been described above in conjunction with FIG. 11 and Equation (5a).

Another method is disclosed herein, wherein the frontside reflectivity of a substrate is calculated by measuring a reflected signal of known magnitude from the frontside of a substrate. By measuring the magnitude of the reflected signal and comparing this to the magnitude of the input signal from the lamps, the frontside reflectivity may be determined. Preferably the input signal is an oscillating function of constant frequency, such as a sinusoidal function, a square wave, a sawtooth wave, or other waveform. In one example, the existing A/C ripple signature that occurs normally with incandescent lamps may be used as the waveform. In any case, this method is very similar in concept to the method for inferring frontside emissivity described in above conjunction with FIG. 11.

The radiant energy reflected from the frontside of the substrate is measured in-situ with a sensor 350 that is installed in the lamp assembly 310 of a chamber 300 (see FIG. 3). In one example, the sensor 350 is a standard pyrometer. In another example, multiple pyrometers are installed in the lamp assembly 310 of the chamber 300 so that reflected energy may be measured at multiple locations of the substrate, such as at each pyrometer zone.

In one example, this method may be used throughout the thermal processing of a substrate to update the value of frontside reflectivity. In another example, the method takes place periodically during the thermal processing of a substrate, for example once each second, and the absorptivity may be updated accordingly. In another example, this method may be only used during specific segments of a thermal process, such as the initial temperature ramp 201 and the stabilization period 202, illustrated in FIG. 1.

In another aspect, the frontside reflectivity of a substrate is measured directly and in-situ with the sensor 350 that is installed in the lamp assembly 310 of a chamber 300 (see FIG. 3). In this aspect, sensor 350 is a reflectometer. Directly measuring the reflectivity of a substrate, either prior to a thermal process or throughout a thermal process, is computationally less demanding than indirect methods, wherein the frontside reflectivity is inferred mathematically. This information may be used to modify lamp input power for more accurate tracking of substrate temperature to the desired time-temperature trajectory.

Substrate Temperature Uniformity

The invention also contemplates methods and apparatus for improving temperature uniformity over the prior art in RTP. As noted above, during thermal processing it is important to have uniform temperature distribution across all regions of a substrate. In one embodiment, a substrate is heated uniformly during RTP by scaling the power output of all lamp groupings in a pre-determined manner based on the frontside emissivity of the substrate—as determined in-situ by one of the methods described above. In another embodiment, substrate temperature uniformity is improved by reducing the edge ring effect through direct temperature control of the edge ring. In another embodiment, lamp groupings are reconfigured as a function of substrate frontside emissivity. In yet another embodiment, at least one lamp grouping consists of a radially asymmetrical group of lamps adapted to treat non-radial temperature non-uniformity detected on a substrate during RTP.

In one embodiment, the edge ring effect on temperature uniformity may be ameliorated by scaling the lamp power of all lamp groupings relative to each other in a pre-determined manner based on the frontside emissivity of the substrate. As noted above in conjunction with FIGS. 12A-12C, the power profile of an RTP chamber during a particular process is a predictable and repeatable function of the substrate frontside emissivity. If the emissivity of the substrate is known, the individual lamp power for each lamp grouping in the chamber may be scaled to match a power profile already known to minimize temperature non-uniformity for the desired substrate and process. For example, for processing a substrate with a lower frontside emissivity than that of the edge ring, lamp powers will be lower for the lamp groupings near the substrate edge, as illustrated by FIG. 12B.

The relative scaling of the lamp power for each lamp grouping may be a purely empirical function or may instead be an idealized power profile, wherein the power profile of the lamp groupings vary as a mathematical expression, such as a linear, parabolic or exponential function.

Figure 13:
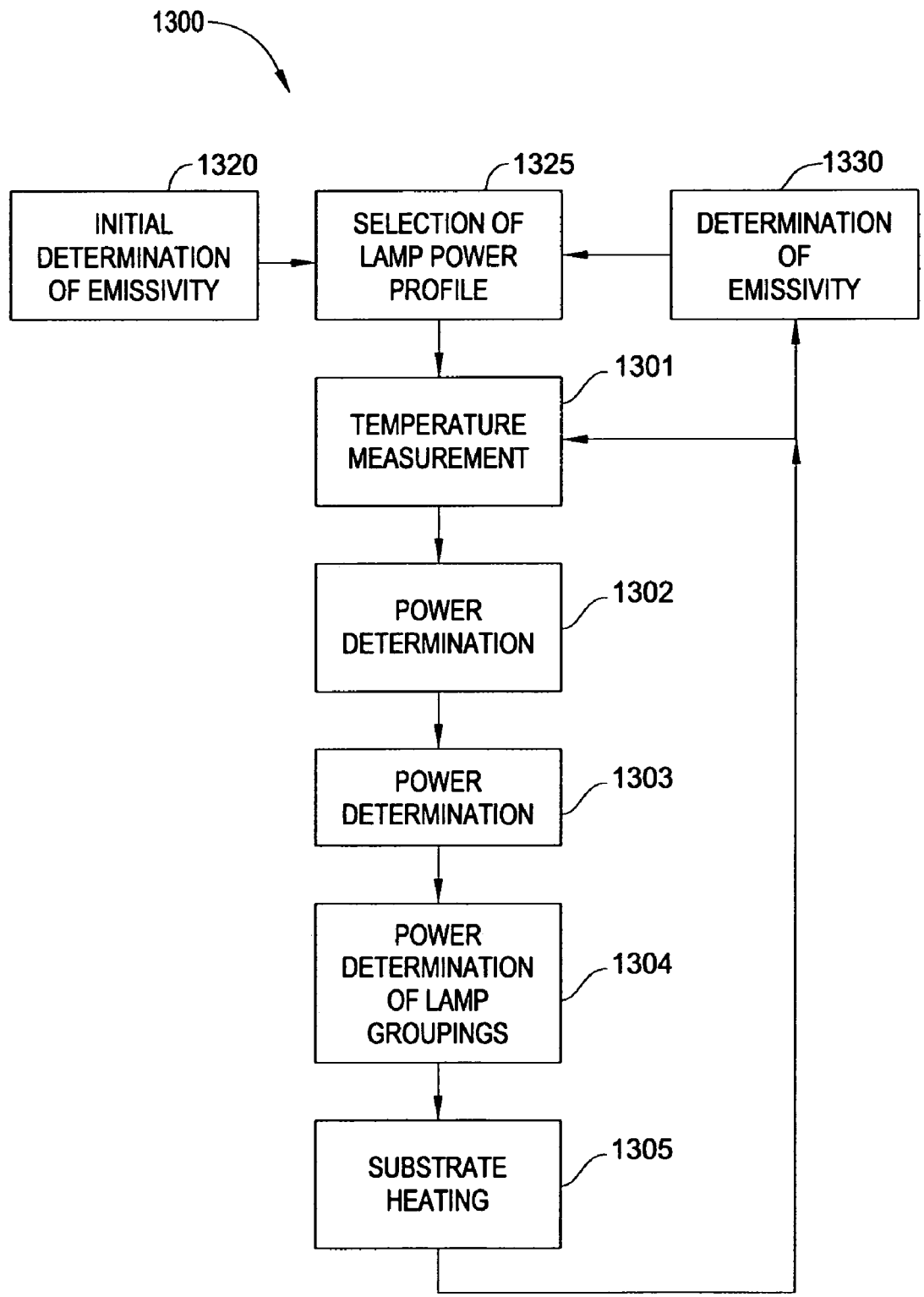
FIG. 13 illustrates a flow chart of a process sequence for improving substrate temperature uniformity during RTP using a lamp power scaling method.

FIG. 13 illustrates a flow chart of a process sequence 1300 for improving substrate temperature uniformity during RTP using this lamp power scaling method. The process sequence 1300 restricts the relative scaling of lamp power between lamp groupings to a power profile already known to reduce temperature non-uniformity.

First, the initial determination of emissivity 1320 occurs, wherein the frontside emissivity of the substrate is determined in-situ using one of the methods described above under Determination of Substrate Optical Properties. Alternatively, frontside emissivity of the substrate may be determined outside the RTP process chamber. Preferably the initial determination of emissivity 1320 is conducted in-situ and, more preferably, at a temperature relatively close to the starting temperature of the temperature-sensitive segment of an RTP process. Because the emissivity is a function of the substrate temperature, the most accurate measurement of emissivity is taken immediately prior to the temperature-sensitive step. For example, for a spike anneal process, where the substrate may be heated to 1200° C., determination of the frontside emissivity is preferred during the stabilization step, wherein the substrate may be held at a temperature between about 500° C. and about 700° C. A room-temperature estimate of the substrate's emissivity will not be as accurate. An accurate measure of the frontside emissivity is important to allow selection of the most appropriate lamp power profile for the thermal process.

Selection of appropriate lamp power profile 1325 takes place after the determination of emissivity 1320 is completed, wherein the selection is based on the measured or inferred frontside emissivity of the substrate.

Temperature measurement 1301 of each pyrometer zone then takes place. This process step will occur at each time step of the rapid thermal process.

Power determination 1302 then takes place, wherein the control algorithm calculates the power required for each pyrometer zone to reach or maintain it's required temperature for the next time step. In this process step a number of algorithms may perform this calculation, including energy transfer models of the substrate, such as those included in conventional model-based controllers. In a preferred example, the instantaneous heating rate, as described above as part of the adaptive control method, is used to determine the power required for each pyrometer zone.

Power determination 1303 then takes place, wherein the control algorithm calculates the total power required for the entire substrate, i.e., by summing the required power for all pyrometer zones.

In the next step, power determination of lamp groups 1304, the control algorithm calculates the appropriate power output to each lamp group for the next time step. The calculation is based on the selected lamp power profile and the total power required for the entire substrate, as calculated in power determination 1303.

Substrate heating 1305 then takes place for the duration of the next time step.

In one aspect, the method then returns to temperature measurement 1301 of the pyrometer zones for the next time step and repeats the above process steps until the thermal processing of the substrate is complete. Alternatively, in another aspect, the substrate frontside emissivity may be re-calculated at the end of each time step. This takes place during determination of emissivity 1330. In this aspect, a new power profile is selected for each time step, during selection of appropriate lamp power profile 1325. Because substrate emissivity is a function of substrate temperature, this aspect allows for an updated value of emissivity for every time step and the selection of the best lamp power profile as substrate emissivity changes during the RTP.

One advantage of this method is that it is computationally less intensive than a purely model-based control algorithm—particularly because the inversion of an influence matrix is not required for determining the relative power output from each lamp grouping for a given time step. Instead of calculating the effect of every lamp grouping on every pyrometer zone, substrate temperature uniformity is maintained by scaling the relative lamp powers of each lamp grouping based on empirically determined lamp power curves.

In addition, this method does not respond to temperature non-uniformities measured on a substrate during thermal processing. Instead, lamp powers are scaled between lamp groupings in order to compensate for the edge ring effect before temperature non-uniformities occur, which may improve overall substrate temperature uniformity.

In another embodiment, substrate temperature uniformity is improved by reducing the edge ring effect on a substrate through direct temperature control of the edge ring during RTP. Referring back to FIGS. 3 and 4, it can be seen that all fiber optic probes 334 are directed at different radial locations of the bottom of a substrate during thermal processing in chamber 300. This allows for the measurement and control of the temperature of concentric regions of the substrate. Because the edge ring is known to have a significant effect on substrate temperature uniformity, this effect may be reduced by more closely matching the temperature of the edge ring to that of the outermost substrate pyrometer zone. With the addition of a fiber optic probe 334*a*, directed at the bottom of edge ring 331, the edge ring may be treated as essentially an additional pyrometer zone. By controlling the temperature of this outer pyrometer zone, i.e. the edge ring, the thermal influence of the edge ring on the substrate may be significantly reduced—even when the emissivity of the edge ring is substantially different than the frontside emissivity of the substrate. In one aspect, wherein one or more of the outer lamp groupings are mapped to the pyrometer associated with fiber optic probe 334*a*, the lamp groupings may act as a dedicated heat source for the edge ring.

In another embodiment, lamp groupings are reconfigured as a function of substrate frontside emissivity in order to provide the best independent control of edge ring temperature. If the frontside emissivity of a substrate is known, for example by the methods described above, then the mapping of lamp groupings to pyrometer zones may be reconfigured to give the optimal power input to the edge ring relative to the outermost pyrometer zones of the substrate. For example, referring to FIGS. 4 and 5, for a darker, high-emissivity substrate, the lamp groupings may be organized so that lamp grouping 535 is mapped to pyrometer zone 405 and lamp groupings 536-538 are mapped to pyrometer zone 406. Due to the edge ring effect, for a highly reflective substrate it may be beneficial to re-map the outer lamp groupings so that lamp groupings 535 and 536 are mapped to pyrometer zone 405 and lamp groupings 537 and 538 are mapped to pyrometer zone 405.

Figure 14:
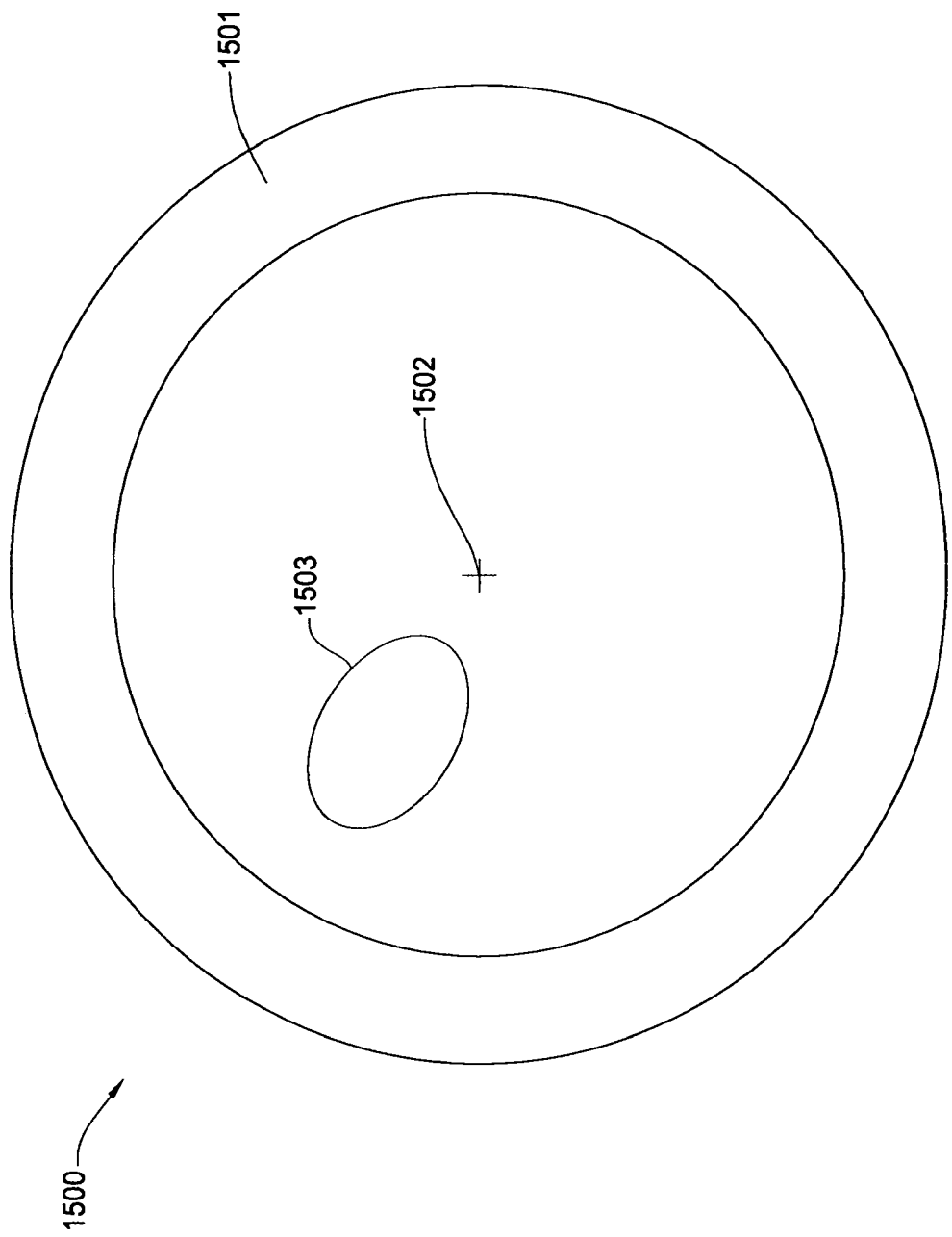
FIG. 14 is a schematic plan view of a substrate with an annular region, a center point and a region that is not radially symmetrical.

In yet another embodiment, at least one lamp grouping consists of a radially asymmetrical group of lamps adapted to treat non-radial temperature non-uniformity detected on a substrate during RTP. The largest temperature non-uniformities occurring on substrates are generally radial, such as an annular region near the edge of a substrate that may be cooler than all other regions of the substrate. FIG. 14 is a schematic plan view of a substrate 1500 with an annular region 1501, a center point 1502 and a region 1503 that is not radially symmetrical about center point 1502. In this example, annular region 1501 corresponds to a region of substrate 1500 that is typically hotter or cooler than the rest of substrate 1500. The temperature non-uniformity in annular region 1501 is best eliminated by increasing or decreasing the power input to that region relative to the other regions of the substrate. Because of this, lamp groupings in an RTP chamber are arranged in substantially concentric zones, as illustrated in FIGS. 5 and 10. This allows for a straightforward correction of temperature in an annular region of the substrate, such as annular region 1501, by increasing or decreasing the power input to that region from the corresponding lamp grouping or groupings.

However, concentric lamp groupings are unable to compensate for temperature non-uniformities that are not radial in nature, such as a temperature non-uniformity in region 1503 of substrate 1500. Instead, one or more lamp groupings may be configured in a non-concentric fashion, as illustrated by the honeycomb array 1600 of lamps in FIG. 15. In one aspect, the non-concentric lamp grouping may consist of a radially oriented line, such as lamp grouping 1601. In another aspect the non-concentric lamp grouping may consist of two or more separate lamp groupings that together form a radially oriented line, such as the combination of lamp groupings 1602 and 1603. In another aspect, a wedge-shaped grouping of lamps may be used, such as lamp grouping 1604, in order to affect an equal fraction of each concentric pyrometer zone. In yet another aspect, the non-concentric lamp grouping may include a combination of lamp groupings 1605, wherein one or more consist of a radially oriented, linear grouping, such as lamp grouping 1605*a*, and one or more consist of a wedge-shaped grouping, such as lamp grouping 1605*b*. Other configurations of non-concentric lamp groupings may also be implemented.

Incorporating one of the lamp grouping configurations described above in conjunction with FIG. 15, with each rotation of a substrate 1500, region 1503 may receive more or less power, as required, than all other regions of substrate 1500, causing region 1503 to thermally equilibrate with the other regions of substrate 1500.

In addition to non-concentric lamp-groupings, such as lamp groupings 1602 and 1603, a control algorithm is necessary effectively mitigate side-to-side temperature non-uniformity on a substrate. The control algorithm should generally synchronize the power distribution to each lamp grouping relative to substrate rotation. In one aspect, an adaptive control algorithm, as described above, may set the average power for an annular region of the substrate, such as a pyrometer zone. A secondary "rotation algorithm" may then be used to asymmetrically partition the average power required over the course of a substrate rotation so that side-to-side temperature non-uniformity present in the pyrometer zone may be reduced.

Although several preferred embodiments which incorporate the teachings of the present invention have been shown and described in detail, those skilled in the art can readily devise many other varied embodiments that still incorporate these teachings.

While the foregoing is directed to embodiments of the present invention, other and further embodiments of the invention may be devised without departing from the basic scope thereof, and the scope thereof is determined by the claims that follow.

The invention claimed is:

1. A method of controlling the temperature of a substrate in a processing chamber during a time interval, wherein the substrate includes at least one zone, comprising:
   measuring the temperature of each zone of the substrate before the time interval;
   calculating the instantaneous heating rate of each zone for the time interval based on the thermal behavior of each zone in at least one preceding time interval;
   determining an input power for each zone to bring each zone to a desired temperature by the end of the time interval based on the instantaneous heating rate; and
   applying the input power for each zone to each respective zone.

2. The method of claim 1, wherein the temperature of the substrate is less than about 500° C. and the process of measuring the temperature of each zone comprises:
   determining the transmissivity of the substrate; and
   measuring the temperature of each zone with a pyrometer by factoring out the energy transmitted through the substrate.

3. The method of claim 2, wherein the process of determining the transmissivity of the substrate comprises using a spectrometer to determine the transmissivity of at least one zone of the substrate.

4. The method of claim 2, wherein the process of determining the transmissivity of the substrate comprises:
   capturing light emitted from the backside of at least one zone;
   splitting the captured light from each zone into a first optical path and a second optical path;
   directing light in the first optical path to a first pyrometer, wherein the first pyrometer is filtered to detect light in a first bandpath;
   directing light in the second optical path to a second pyrometer, wherein the second pyrometer is filtered to detect light in a second bandpath and wherein the second bandpath includes longer frequency light than the first bandpath; and
   comparing the total energy detected by the first pyrometer and the second pyrometer.

5. The method of claim 2, wherein the process of determining the transmissivity of the substrate comprises:
   applying a power input waveform to at least one zone, wherein the power input waveform has a first magnitude;
   measuring a power waveform corresponding to the sum of the energy transmitted through the at least one zone and the energy emitted from the backside of the at least one zone, the power waveform having a second magnitude; and
   comparing the first magnitude and the second magnitude.

6. The method of claim 1, wherein the temperature of the substrate is less than about 500° C. and the process of measuring the temperature of each zone comprises using almost room temperature pyrometry.

7. The method of claim 1, wherein the process of calculating the instantaneous heating rate of each zone further comprises:
   calculating a first temperature ramp rate of the zone resulting from a first power input during a first time interval;
   calculating a second temperature ramp rate of the zone resulting from a second power input during a second time interval;
   assuming that the instantaneous heating rate of the zone is a linear function in time and is proportional to an input power, wherein the linear function includes a constant slope and a constant intercept; and
   solving for a new slope value and a new intercept value using the first ramp rate, the second ramp rate, the first power input and the second power input.

8. The method of claim 7, further comprising:
   using a value for the slope that is a weighted average of the new slope value and preceding values of the slope; and
   using a value for the intercept that is a weighted average of the new intercept value and preceding values of the intercept.

9. The method of claim 8, wherein the weighted average is an exponentially time-weighted average.

10. The method of claim 1, wherein the at least one zone includes multiple substantially concentric zones, each zone being substantially heated by a corresponding heat source that produces an output power.

11. The method of claim 10, further comprising calculating the output power for each heat source based on the input power for each zone and an influence matrix.

12. The method of claim 11, wherein the influence matrix is determined in the chamber.

13. The method of claim 11, wherein each heat source is a lamp grouping and wherein calculating the output power for each heat source further comprises compensating for lamp transient response by including an overshoot power in the output power for each lamp grouping.

14. A method of processing a substrate during thermal processing comprising:
   determining the value of an optical property of the substrate during thermal processing;
   selecting a binned control algorithm based on the value of the optical property; and
   controlling the temperature of the substrate for a first portion of the thermal processing using the binned control algorithm.

15. The method of claim 14, wherein the optical property is selected from the group consisting of frontside emissivity, frontside reflectivity and absorptivity.

16. The method of claim 15, wherein the process of determining an optical property further comprises:
   measuring the temperature of a region of the substrate;
   applying an input power to the frontside of the region for a time increment;
   re-measuring the temperature of the region after the time increment; and inferring the frontside emissivity of the substrate based on the temperature increase during the time increment.

17. The method of claim 16, further comprising inferring the frontside reflectivity based on the frontside emissivity.

18. The method of claim 16, further comprising holding the substrate substantially at thermal equilibrium prior to measuring the temperature of a region of the substrate.

19. The method of claim 15, wherein the process of determining an optical property further comprises:
   determining the transmissivity of the substrate;
   measuring the temperature of the substrate with a pyrometer by factoring out the energy transmitted through the substrate; and
   inferring the frontside emissivity of the substrate based on temperature increase of the substrate.

20. The method of claim 19, further comprising inferring the frontside reflectivity based on the frontside emissivity.

21. The method of claim 19, wherein the process of determining the transmissivity of the substrate comprises using a spectrometer to determine the transmissivity of at least one zone of the substrate.

22. The method of claim 19, wherein the process of determining the transmissivity of the substrate comprises using almost room temperature pyrometry.

23. The method of claim 19, wherein the process of determining the transmissivity of the substrate comprises:
   capturing light emitted from the backside of the substrate;
   splitting the captured light into a first optical path and a second optical path;
   directing light in the first optical path to a first pyrometer, wherein the first pyrometer is filtered to detect light in a first bandpath;
   directing light in the second optical path to a second pyrometer, wherein the second pyrometer is filtered to detect light in a second bandpath and wherein the second bandpath includes longer frequency light than the first bandpath; and
   comparing the total energy detected by the first pyrometer and the second pyrometer.

24. The method of claim 19, wherein the process of determining the transmissivity of the substrate comprises:
   applying a power input waveform to the substrate, wherein the power input waveform has a first magnitude;
   measuring a power waveform corresponding to the sum of the energy transmitted through the substrate and the energy emitted from the backside of the substrate, the power waveform having a second magnitude; and
   comparing the first magnitude and the second magnitude.

25. The method of claim 14, wherein the optical property comprises frontside emissivity and the process of determining the value of the optical property comprises:
   controlling the substrate temperature during an earlier portion of the thermal processing using a closed-loop control algorithm; and
   inferring the frontside emissivity based on the power profile demonstrated during the earlier portion of the thermal processing.

26. The method of claim 14, wherein the substrate includes at least one zone and wherein the method further comprises:
   controlling the temperature of the substrate for a second portion of the thermal processing using a method comprising:
      measuring the temperature of each zone of the substrate before a time interval, wherein the time interval takes place during the second portion of the thermal processing;
      calculating the instantaneous heating rate of each zone for the time interval based on the thermal behavior of each zone in at least one preceding time interval;
      determining an input power for each zone to bring each zone to a desired temperature by the end of the time interval based on the instantaneous heating rate; and
      applying the input power for each zone to each respective zone.

27. The method of claim 26, wherein:
   the second portion of the thermal processing precedes the first portion of the thermal processing; and
   determining the value of an optical property of the substrate during thermal processing takes place during the second portion of the thermal processing.

28. The method of claim 14, wherein the substrate includes at least one zone and wherein the binned control algorithm comprises:
   measuring the temperature of each zone of the substrate before a time interval, wherein the time interval takes place during the thermal processing;
   calculating the instantaneous heating rate of each zone for the time interval based on the thermal behavior of each zone in at least one preceding time interval;
   determining an input power for each zone to bring each zone to a desired temperature by the end of the time interval based on the instantaneous heating rate; and
   applying the input power for each zone to each respective zone.

29. The method of claim 28, wherein the process of calculating the instantaneous heating rate of each zone further comprises:
   calculating a first temperature ramp rate of the zone resulting from a first power input during a first time interval;
   calculating a second temperature ramp rate of the zone resulting from a second power input during a second time interval;
   assuming that the instantaneous heating rate of the zone is a linear function in time and is proportional to an input power, wherein the linear function includes a constant slope and a constant intercept; and
   solving for a new slope value and a new intercept value using the first ramp rate, the second ramp rate, the first power input and the second power input;
   using a value for the slope that is a weighted average of the new slope value and a first number of preceding values of the slope; and
   using a value for the intercept that is a weighted average of the new intercept value and a second number of preceding values of the intercept.

30. The method of claim 29, wherein the first number and the second number are based on the value of the optical property.

31. A method of processing a substrate in a chamber during thermal processing, wherein the chamber comprises a first lamp grouping and at least one additional lamp grouping, comprising:
   determining the value of an optical property of the substrate during thermal processing;
   selecting a binned control algorithm based on the value of the optical property; and
   controlling the temperature of the substrate for a portion of the thermal processing, wherein the process of controlling the temperature comprises:
      controlling the power output of the first lamp grouping using open-loop control; and controlling the power output of the at least one additional lamp grouping using the binned control algorithm.

32. The method of claim 31, wherein the first lamp grouping contains more than half of the total lamps in the chamber.

33. The method of claim 31, wherein the optical property is selected from the group consisting of frontside emissivity, frontside reflectivity and absorptivity.

* * * * *